(12) United States Patent
Kaya et al.

(10) Patent No.: US 12,125,905 B2
(45) Date of Patent: Oct. 22, 2024

(54) SEMICONDUCTOR DEVICE

(71) Applicant: RENESAS ELECTRONICS CORPORATION, Tokyo (JP)

(72) Inventors: Yoshinori Kaya, Tokyo (JP); Katsumi Eikyu, Tokyo (JP); Akihiro Shimomura, Tokyo (JP); Hiroshi Yanagigawa, Tokyo (JP); Kazuhisa Mori, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/905,071

(22) Filed: Jun. 18, 2020

(65) Prior Publication Data

US 2020/0411683 A1 Dec. 31, 2020

(30) Foreign Application Priority Data

Jun. 28, 2019 (JP) ................................ 2019-120692

(51) Int. Cl.
H01L 29/78 (2006.01)
H01L 29/06 (2006.01)
(Continued)

(52) U.S. Cl.
CPC ...... *H01L 29/7813* (2013.01); *H01L 29/0615* (2013.01); *H01L 29/0634* (2013.01);
(Continued)

(58) Field of Classification Search
CPC ............. H01L 29/7813; H01L 29/4236; H01L 29/0634; H01L 29/1095; H01L 29/66734; H01L 29/41766; H01L 29/0696
See application file for complete search history.

(56) References Cited

U.S. PATENT DOCUMENTS 6,191,447 B1 * 2/2001 Baliga ............... H01L 29/42368
257/330
8,008,717 B2 * 8/2011 Kawashima ........ H01L 29/7813
257/334
(Continued)

FOREIGN PATENT DOCUMENTS

JP 2006-332607 A 12/2006
JP 2010-016309 A 1/2010
(Continued)

OTHER PUBLICATIONS

Japanese Notice of Reasons for Refusal issued in corresponding Japanese Patent Application No. 2019-120692, dated Oct. 25, 2022, with English translation.
(Continued)

*Primary Examiner* — Britt D Hanley
*Assistant Examiner* — Victor V Barzykin
(74) *Attorney, Agent, or Firm* — Rimon P.C.

(57) ABSTRACT

To reduce on-resistance while suppressing a characteristic variation increase of a vertical MOSFET with a Super Junction structure, the vertical MOSFET includes a semiconductor substrate having an n-type drift region, a p-type base region formed on the surface of the n-type drift region, a plurality of p-type column regions disposed in the n-type drift region at a lower portion of the p-type base region by a predetermined interval, a plurality of trenches whose bottom surface reaches a position deeper than the p-type base region and that is disposed between the adjacent p-type column regions, a plurality of gate electrodes formed in the plurality of trenches, and an n-type source region formed on the side of the gate electrode in the p-type base region.

5 Claims, 27 Drawing Sheets

(51) Int. Cl.
  *H01L 29/10* (2006.01)
  *H01L 29/417* (2006.01)
  *H01L 29/423* (2006.01)
  *H01L 29/66* (2006.01)

(52) U.S. Cl.
  CPC ...... *H01L 29/0696* (2013.01); *H01L 29/1095* (2013.01); *H01L 29/41766* (2013.01); *H01L 29/4236* (2013.01); *H01L 29/66734* (2013.01); *H01L 29/7828* (2013.01); *H01L 29/7831* (2013.01); *H01L 29/0692* (2013.01)

(56) References Cited

U.S. PATENT DOCUMENTS

| | | | |
|---|---|---|---|
| 8,450,800 B2 | 5/2013 | Inomata | |
| 8,482,030 B2* | 7/2013 | Aono | H01L 29/0834 257/139 |
| 8,829,608 B2* | 9/2014 | Saito | H01L 29/66734 257/E29.257 |
| 9,923,091 B2 | 3/2018 | Kudou et al. | |
| 2002/0027237 A1* | 3/2002 | Onishi | H01L 29/0634 257/262 |
| 2006/0006458 A1* | 1/2006 | Motai | H01L 29/7802 257/330 |
| 2006/0216896 A1* | 9/2006 | Saito | H01L 24/05 438/270 |
| 2006/0244056 A1 | 11/2006 | Miura | |
| 2006/0284248 A1* | 12/2006 | Saito | H01L 29/7802 257/341 |
| 2010/0032752 A1* | 2/2010 | Hozumi | H01L 29/7813 257/331 |
| 2012/0012929 A1* | 1/2012 | Saito | H01L 29/7813 257/E29.256 |
| 2017/0125515 A1* | 5/2017 | Shirakawa | H01L 29/0869 |
| 2018/0374919 A1* | 12/2018 | Tilke | H01L 21/31155 |
| 2020/0235203 A1* | 7/2020 | Furuhashi | H01L 29/7802 |
| 2021/0083061 A1* | 3/2021 | Darwish | H01L 29/66734 |

FOREIGN PATENT DOCUMENTS

| | | |
|---|---|---|
| JP | 2011-216847 A | 10/2011 |
| JP | 2012-23272 A | 2/2012 |
| JP | 2017-168501 A | 9/2017 |

OTHER PUBLICATIONS

Japanese Notice of Reasons for Refusal issued in corresponding Japanese Patent Application No. 2019-120692, dated Mar. 14, 2023, with English translation.

Japanese Decision of Refusal issued in corresponding Japanese Patent Application No. 2019-120692, dated Aug. 8, 2023, with English translation.

* cited by examiner

SEMICONDUCTOR DEVICE

CROSS-REFERENCE TO RELATED APPLICATIONS

The disclosure of Japanese Patent Application No. 2019-120692 filed on Jun. 28, 2019 including the specification, drawings and abstract is incorporated herein by reference in its entirety.

BACKGROUND

The present invention relates to a semiconductor device including a vertical MOSFET (Vertical type Metal Oxide Field Effect Transistor) with a trench gate, in particular, an effective technique for a semiconductor device comprising a so-called super junction structure (hereinafter, referred to as SJ structure) having a p-type column region formed so as to protrude from the bottom of the p-type base region toward the n-type drift region.

A semiconductor device with an SJ structure includes, for example, a semiconductor substrate comprising an n-type drift region, a p-type base region formed on the surface of the n-type drift region, a plurality of p-type column regions coupled to the p-type base region and arranged at predetermined intervals in the n-type drift region, a gate electrode disposed between adjacent p-type column regions and formed in trench reaching the bottom surface of the p-type base region, and an n-type source region formed in the p-type base region on the side of the gate electrode.

An example of the semiconductor device with such an SJ structure is described in Japanese Unexamined Patent Application Publication No. 2017-168501 (Patent Document 1). In the same document, a vertical MOSFET having a plurality of p-type column regions formed in a stripe-like shape, and a stripe-like shape gate electrode disposed between the adjacent p-type column regions along the p-type column regions in a plan view is disclosed.

SUMMARY

The inventors of the present application have found the following concerns when attempting to further reduce the on-resistance of a vertical MOSFET including an SJ structure.

When the on-resistance of the vertical MOSFET having the so-called SJ structure as described in Patent Document 1 is further reduced, the decrease of the pitching of the periodic p-type column region and the increase of the concentration of the n-type drift region or the p-type column region are effective. However, the sensitivity with the dimensional change of the p-type column region and the n-type drift region for the breakdown voltage and the normalized on-resistance of the vertical MOSFET is increased, therefore there is a problem with increasing characteristic variation of the vertical MOSFET.

Other problems and novel features will become apparent from the description of the specification and drawings.

A semiconductor device according to an embodiment of this disclosure includes a semiconductor substrate comprising an n-type drift region, a p-type base region formed on the surface of the n-type drift region, a plurality of p-type column regions disposed in the n-type drift region at a lower portion of the base region by a predetermined interval, a plurality of trenches whose bottom surface reaches a position deeper than the p-type base region and disposed between the adjacent p-type column regions, a plurality of gate electrodes formed through a gate insulating film in the plurality of trenches, and an n-type source region formed in the p-type base region on the side of the gate electrodes.

By means of the semiconductor device according to an embodiment, while suppressing the increase of characteristic variation of the vertical MOSFET including SJ structure, it is possible to reduce the on-resistance.

DETAILED DESCRIPTION

Figure 1:
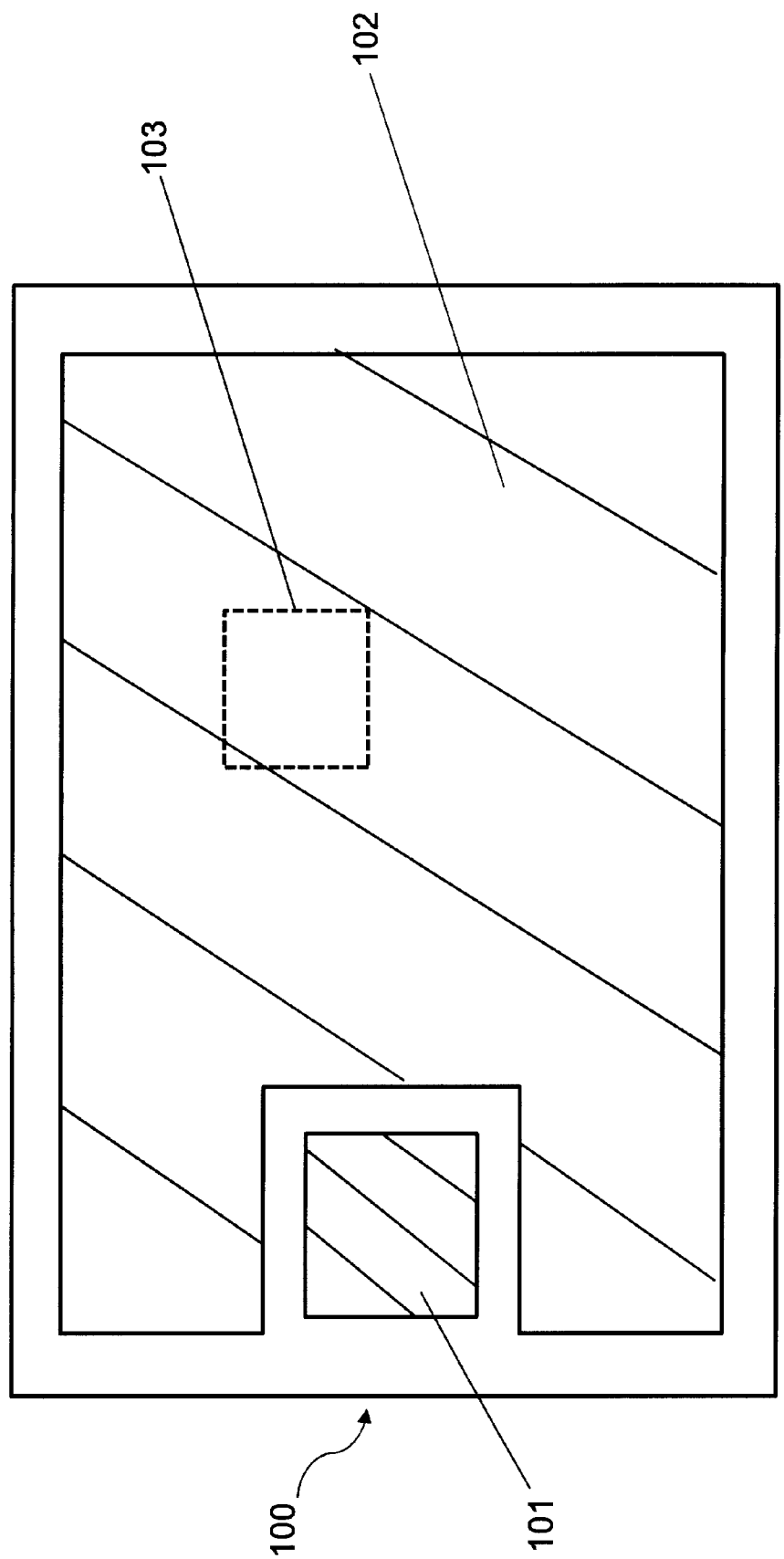
FIG. 1 is a plan view of a semiconductor device with a vertical MOSFET structure according to an embodiment.

Referring to the drawings, a semiconductor device according to an embodiment will be described in detail. In the specification and the drawings, the same or corresponding structure elements are denoted by the same reference numerals, and a repetitive description thereof is omitted. Also, at least a part of the embodiments and each modification may be arbitrarily combined with each other. In addition, in each cross-sectional view, the oblique line indicating that the space is not a cavity may be omitted in order to make the drawing easier to see. If a cavity is indicated, it shall be specified separately in the specification that it is a cavity.

Code "−" and "+" represent the relative density of an impurity of type n or p, for example, in the case of the impurity of type n, the impurity density is high in the order of the "n−−" of the lowest, "n−", "n", "n+", "n++" of the highest.

First Embodiment

The semiconductor device according to the present embodiment will be described with reference to FIGS. 1 to 3. As shown in FIG. 1, a semiconductor device with a vertical MOSFET has a gate pad 101 and a source pad 102 on the main surface of semiconductor substrate 100. Reference numeral 103 schematically illustrates a cell area of a vertical MOSFET located on the underside of source pad 102.

Figure 2:
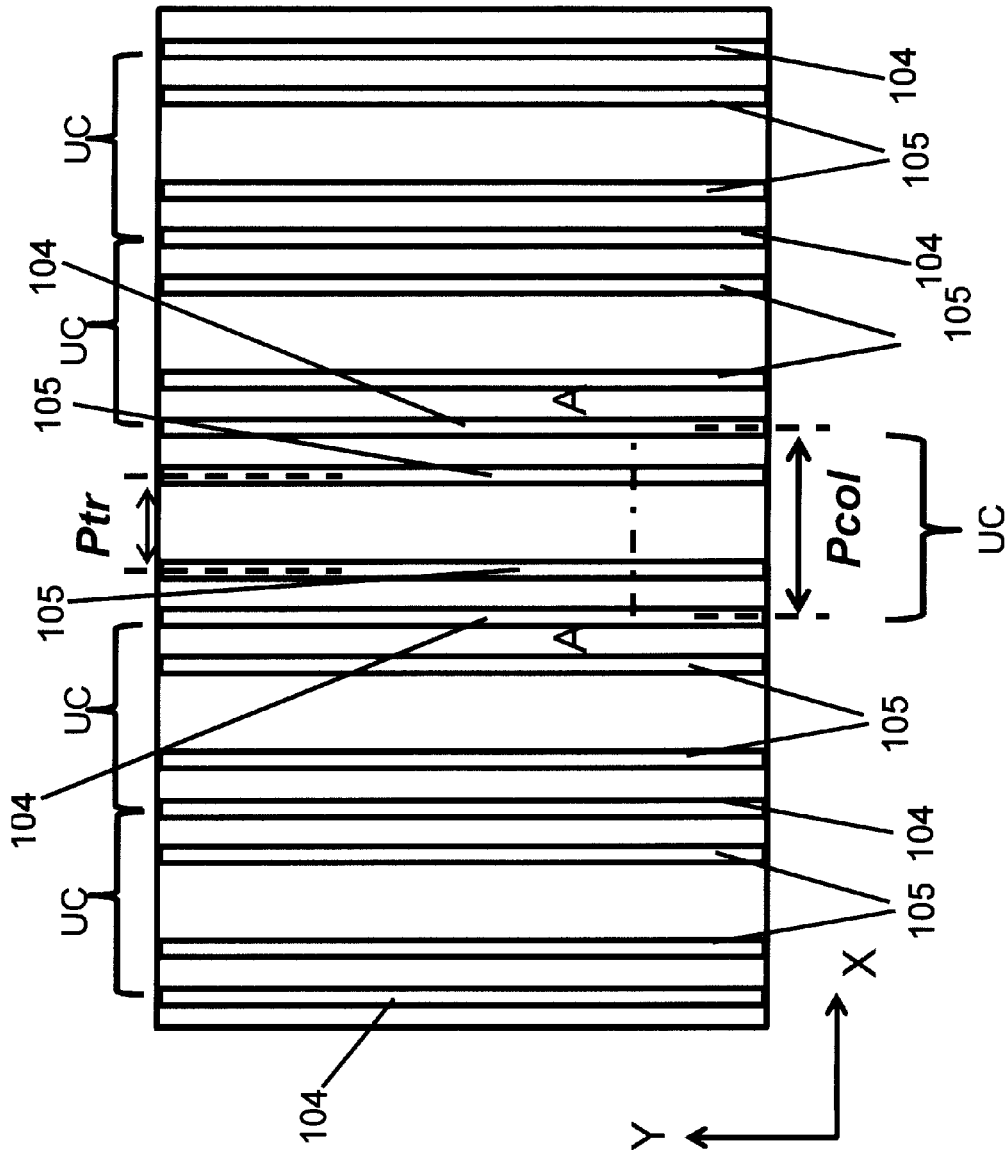
FIG. 2 is an enlarged plan view of the cell area shown by the dotted line in FIG. 1.

FIG. 2 is an enlarged plan view in the cell area 103 shown by the dotted line in FIG. 1, a plurality of p-type column regions 104 along the Y-direction and a plurality of trench gates, i.e., gate electrodes, 105 are disposed in parallel. The interval Pcol of the p-type column regions 104 and the interval Ptr of the trench gate 105, respectively, are set at regular intervals, and the interval Pcol is twice the interval Ptr as a preferred value in the present embodiment. Furthermore, assuming the width of the trench gate 105 in the X direction as Wtr, the unit cell UC is designed so that there is always overlap with the trench gate 105 of more than twice the width Wtr when following the line connecting the adjacent p-type column region 104 hypothetically.

Figure 3:
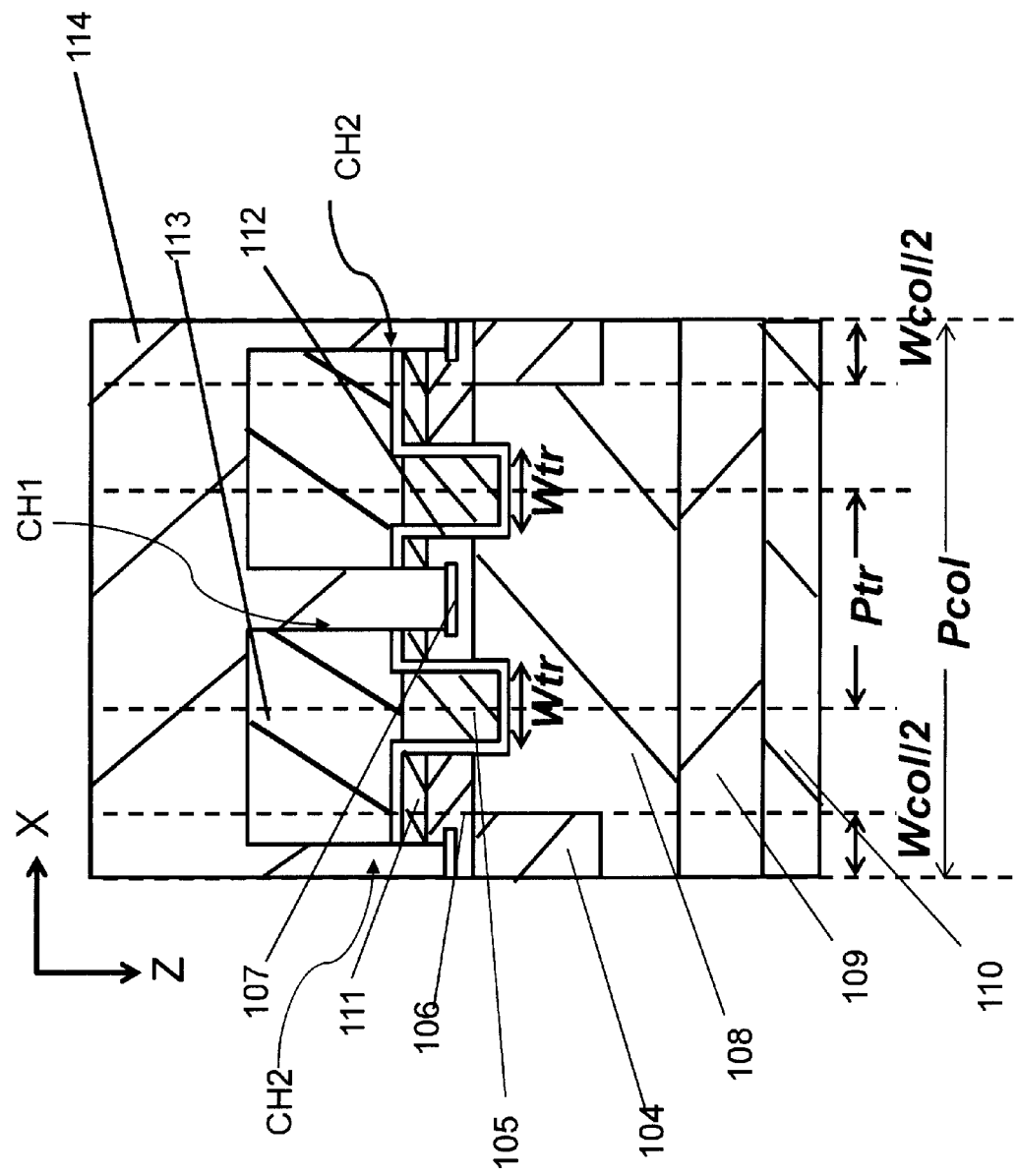
FIG. 3 is a cross-sectional view of main portion of the unit cell UC in FIG. 2.

As shown in FIG. 3, a p-type base region 106 and a p+ type base contact region 107 are repeatedly formed between the adjacent trench gates 105 in the X-direction in parallel with each other at a distance Ptr.

FIG. 3 is a A-A cross-sectional view of FIG. 2. Each unit cell UC of the vertical type MOSFET includes a n− type drift region 108 formed by a n− type epitaxial layer in semiconductor substrate 100, a n+ type drain region 109 formed by a n+ type semiconductor layer of high impurity concentration at the bottom of n− type drift region 108, and a drain electrodes 110 electrically coupled to the bottom of n+ type drain region 109. In the p-type base region 106, a n+ type source region 111 formed by a n+ type semiconductor layer of high impurity concentration is formed. n+ source region 111 is formed shallower than the p-type base region 106, and the p-type column region 104 is formed deeper than the p-type base region 106, in the Z direction which is the thickness direction of the semiconductor substrate 100. Between the adjacent p-type column regions 104, the trench gates 105 are formed so as to fill two trenches formed by etching the surface of n− drift regions 108. A gate insulating film 112 is formed at the interface between n− drift region 108 and the trench gate 105. An insulating film 113 is formed on upper surface of n− type drift region 108 so as to cover the trench gate 105 and n+ type source region 111, and source electrodes 114 are formed on upper surface of the insulating film 113.

The source electrodes 114 are formed between adjacent trench gates 105 deeper than n+ type source region 111 and shallower than p type base region 106 through a stripe-like shape contact hole CH1 formed in insulation film 113, and are coupled to p+ type base contact region 107. Further, the source electrode 114 is coupled to p+ type base contact region 107 formed on the p-type column region 104 through a stripe-like shape contact hole CH2 formed in the insulating film 113.

Figure 4:
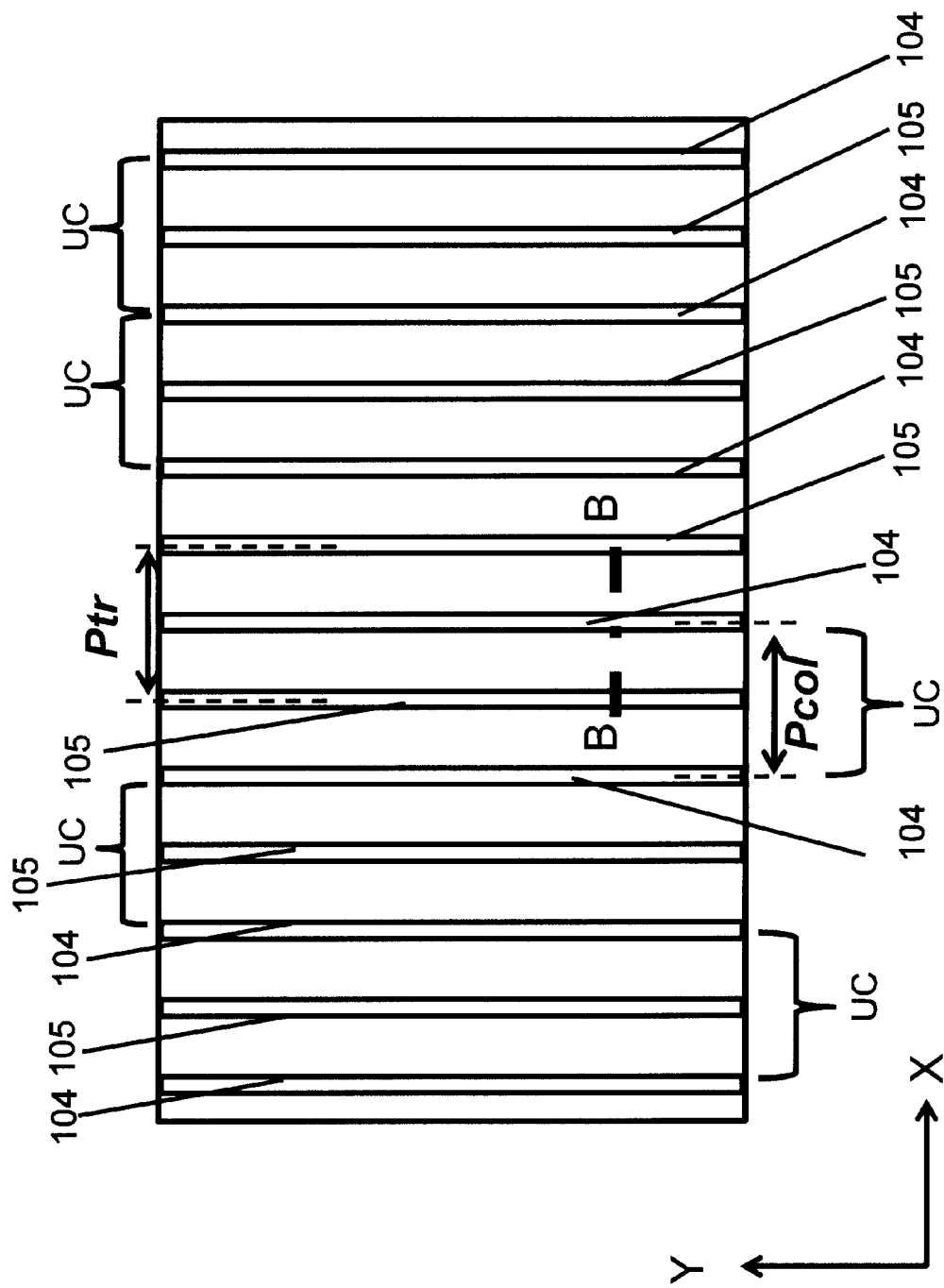
FIG. 4 is an enlarged plan view of the cell area showing a comparison example of a semiconductor device with a vertical MOSFET structure according to an embodiment.
Figure 5:
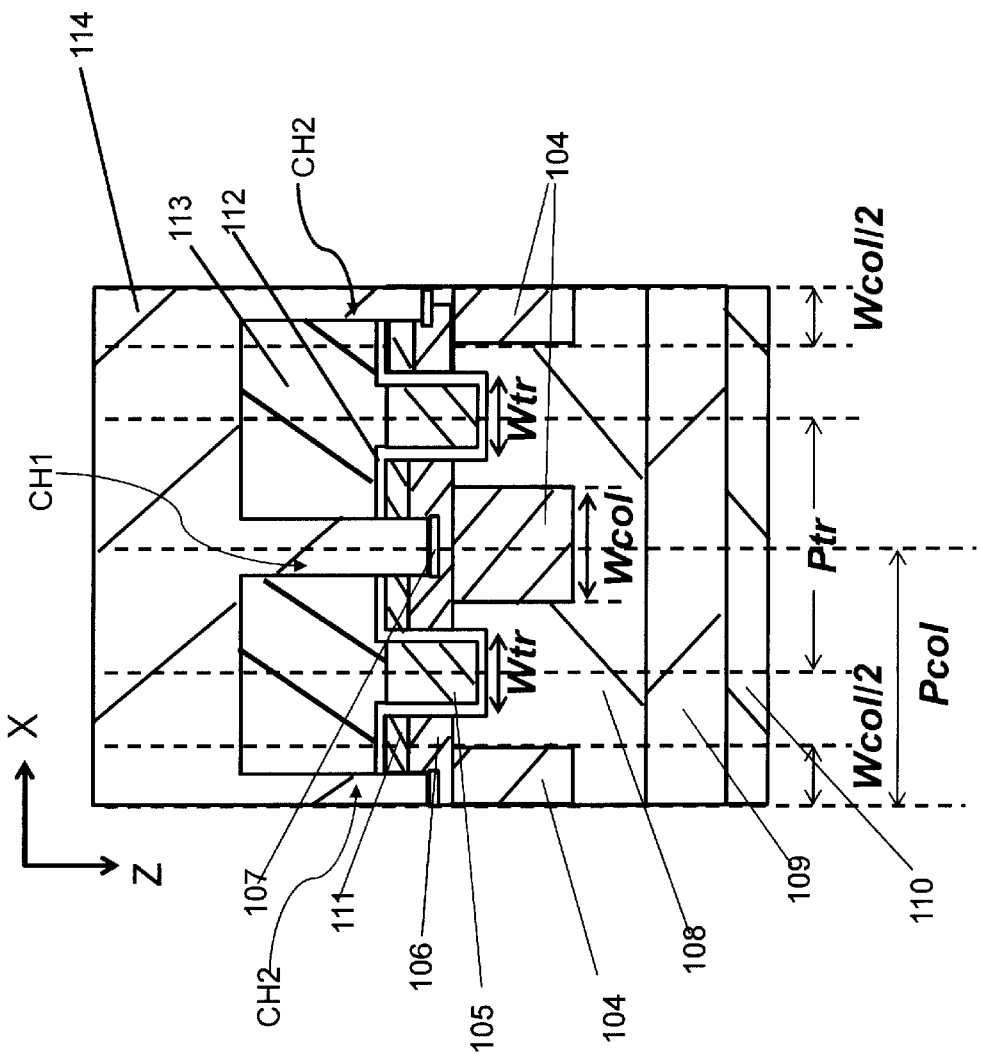
FIG. 5 is a cross-sectional view of main portion of the unit cell UC in FIG. 4.

In order to compare the configuration of the vertical MOSFET according to the first embodiment described above, FIGS. 4 and 5 show a comparison example against the vertical MOSFET described in FIGS. 2 and 3. Incidentally, FIG. 5 is a B-B cross-sectional view in FIG. 4. The vertical MOSFET shown in FIGS. 4 and 5 is configured to always dispose the p-type column regions 104 between adjacent trench gates 105. That is, between the adjacent p-type column region 104, only one stripe-like shape trench gate 105 is disposed in a plan view in this configuration.

On the other hand, the vertical MOSFET according to the first embodiment is possible to ensure a wider current path by reducing the occupancy rate of the p-type column region 104 per unit cell UC in a plan view against the comparison example of FIGS. 4 and 5. Furthermore, even when the repetition interval Ptr of the trench gate 105 is reduced to improve the gate density, since the repetition interval Pcol of the p-type column region and the drift region (also referred to as an n-column) can ensure a distance of twice the interval Ptr, it is possible to reduce the on-resistance without the need to excessively high the impurity concentration of the p-type column region and the drift region.

Figure 6:
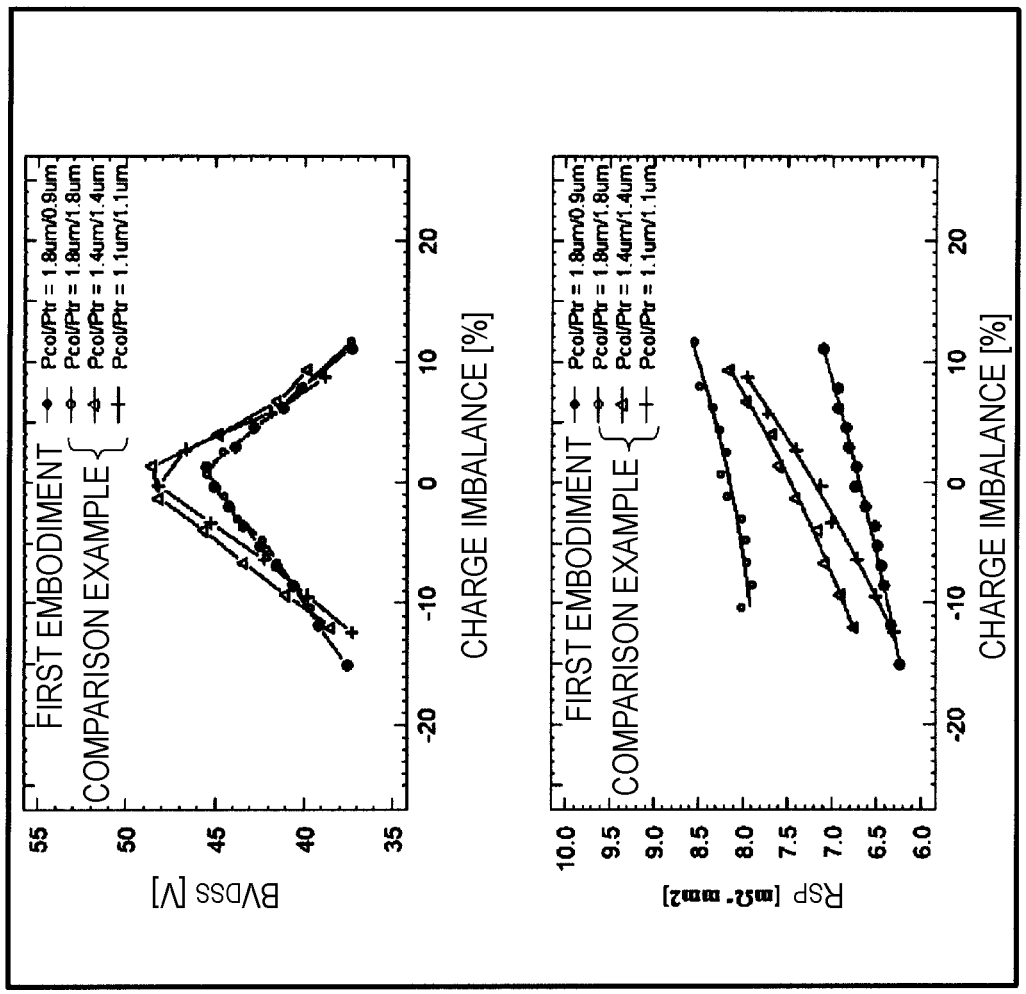
FIG. 6 is a graph showing the relationship between the breakdown voltage BVdss and the normalized on-resistance Rsp of the vertical MOSFET according to an embodiment and a comparison example.

FIG. 6 shows the relationship between the charge imbalance rate (balance of the charge amount of the p-type and n-type column regions) and the breakdown voltage BVdss and the normalized on-resistance Rsp when the charge amount of the p-type column region and n-type column region is equal and then the maximum breakdown voltage of the vertical MOSFET is obtained.

In the vertical MOSFET of the comparison example shown in FIGS. 4 and 5, Pcol/Ptr needs to be reduced, and the p-type and n-type column regions need to be highly concentrated in order to reduce the normalized on-resistance Rsp while maintaining the charge imbalance margin satisfying a certain breakdown voltage or more. Therefore, there has been a problem that the sensitivity of the breakdown voltage and the normalized on-resistance Rsp to the charge imbalance rate becomes high.

On the other hand, the vertical MOSFET structure of the first embodiment is possible to significantly reduce the normalized on-resistance Rsp without increasing the sensitivity of the breakdown voltage BVdss and the normalized on-resistance Rsp to the charge imbalance ratio. Therefore, the vertical MOSFET structure can not only improve the basic performance, but also be more resistant to the manufacturing variation, and then improve the product yield.

Figure 7:
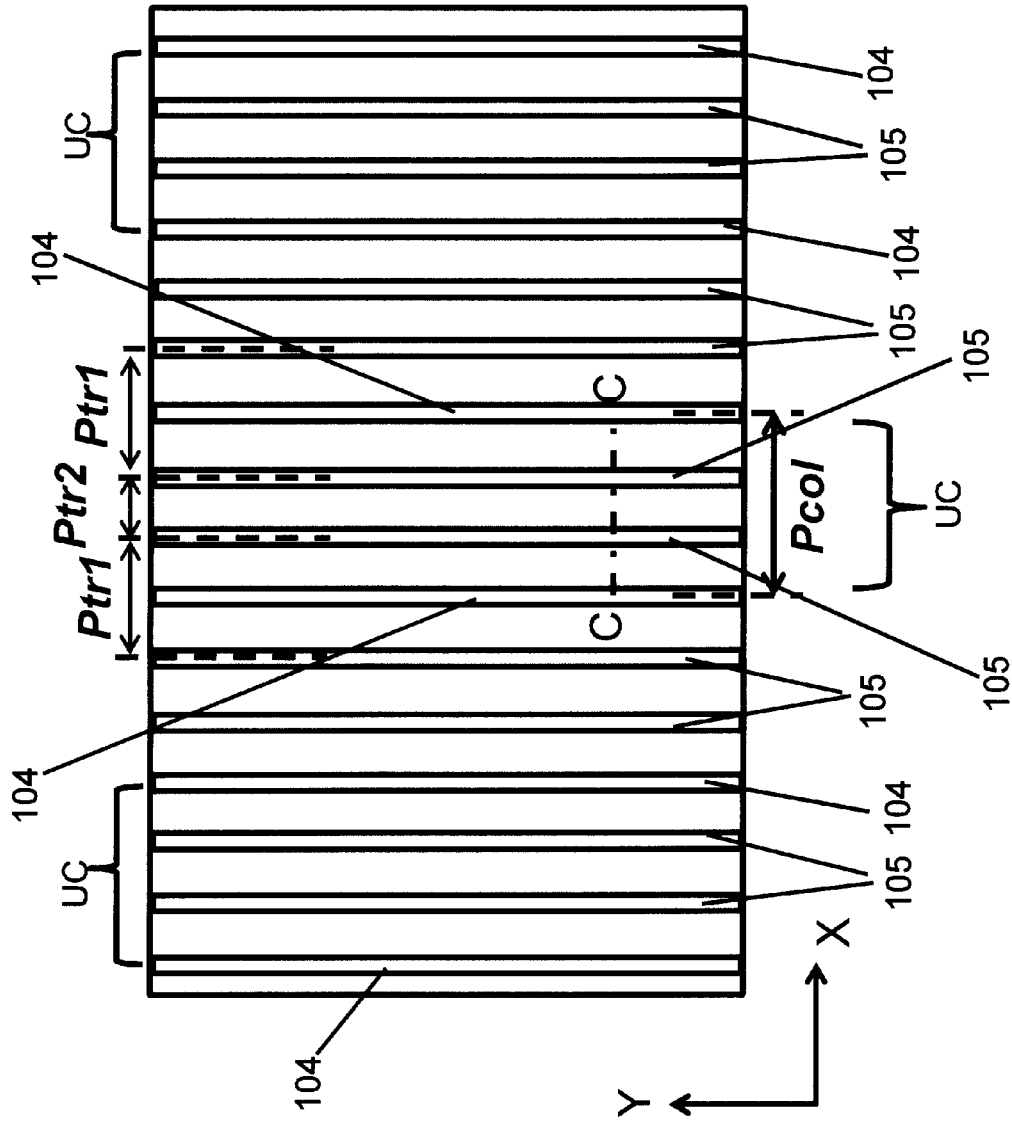
FIG. 7 is an enlarged plan view of the cell area showing a first modified example of a semiconductor device with a vertical MOSFET structure according to an embodiment.
Figure 8:
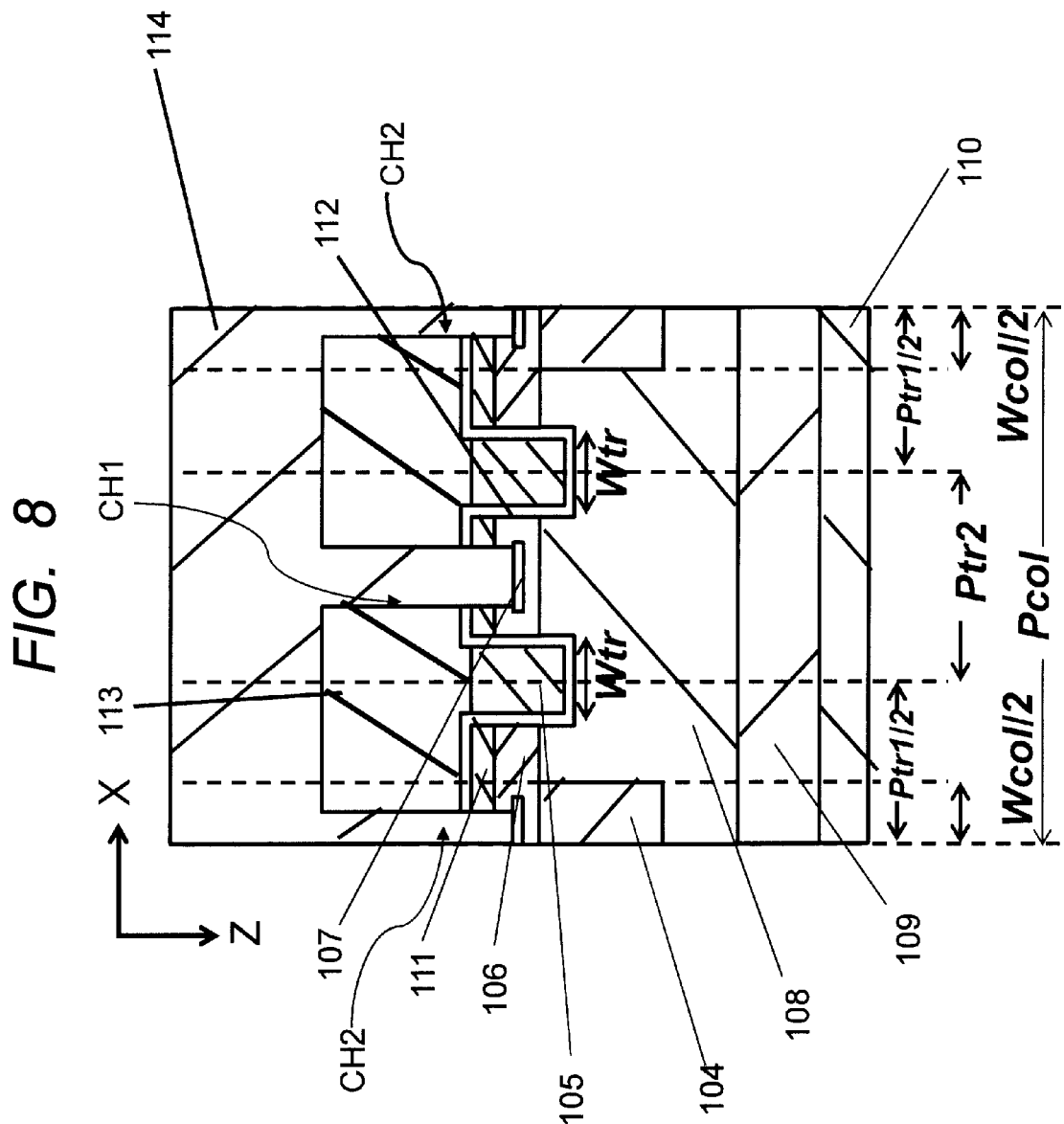
FIG. 8 is a cross-sectional view of main portion of the unit cell UC in FIG. 7.

(First modified example) A first modified example of the first embodiment is shown in FIGS. 7 and 8. Compared to the first embodiment, the first modified example is changed in that the repetition interval of the trench gate 105 has two types of interval Ptr1 and Ptr2, and if the repetition interval of the p-type column region 104 and the trench gate 105 is Pcol, the interval Pcol has an additive relationship of the interval Ptr1 and the interval Ptr2. Incidentally, FIG. 8 is a C-C cross-sectional view in FIG.

Since the semiconductor device of the first modified example has such a relationship, the design flexibility of the unit cell is higher than that of the first embodiment, and the distance between the p-type column region 104 and the trench gate 105 can be increased, so that the effect of the p-type column region 104 on the channel resistance can be suppressed. Further, since the distances between the PN junction of the p-type column region and the n-type column region, i.e., n− type drift region 108, and the trench gate 105 can be increased, coupling by electric field magnitude that increase in the respective lower portions of the PN junctions and the trench gate 105 can be alleviated, so that the breakdown voltage can be improved.

Figure 9:
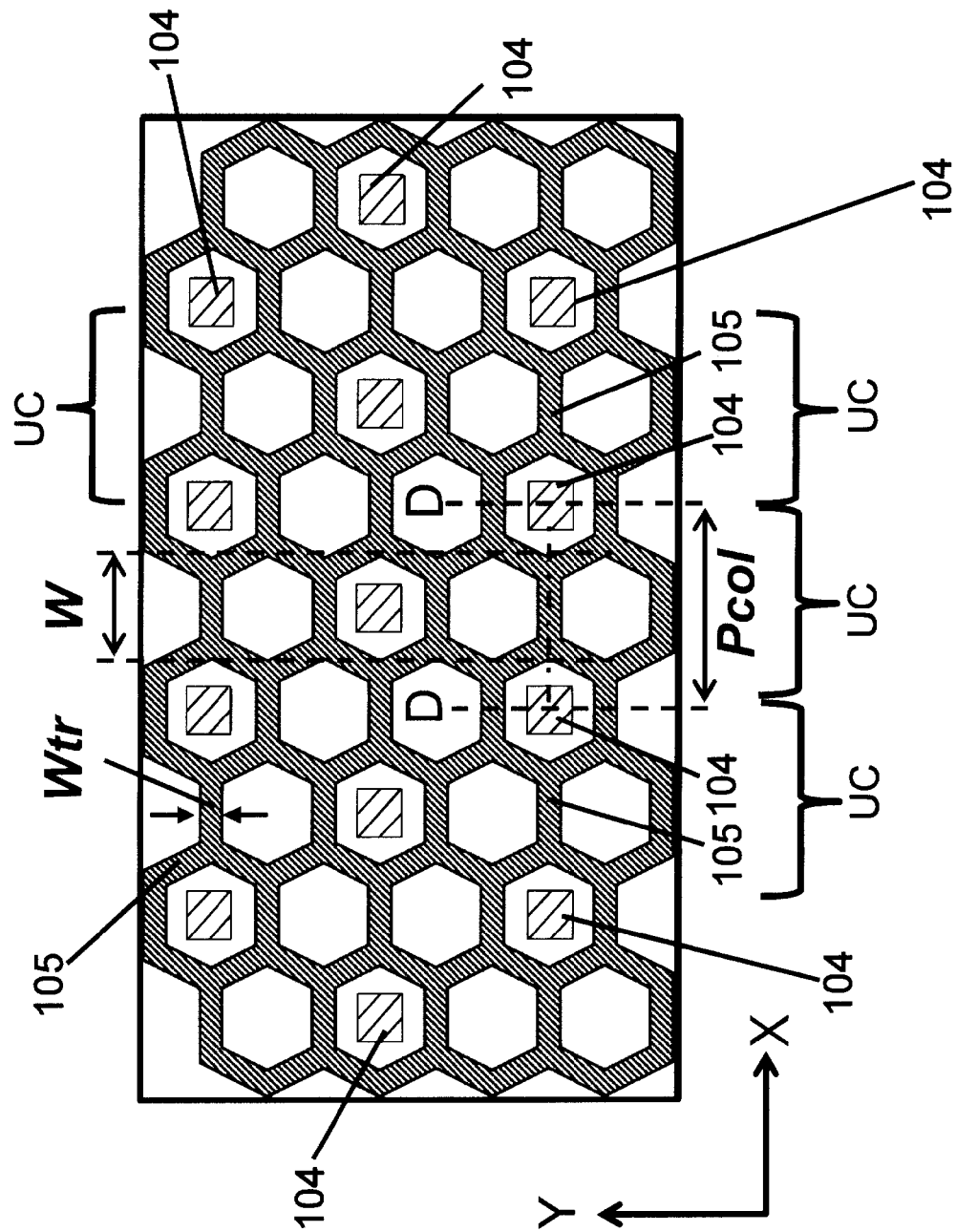
FIG. 9 is an enlarged plan view of the cell area showing a second modified example of a semiconductor device with a vertical MOSFET structure according to an embodiment.
Figure 10:
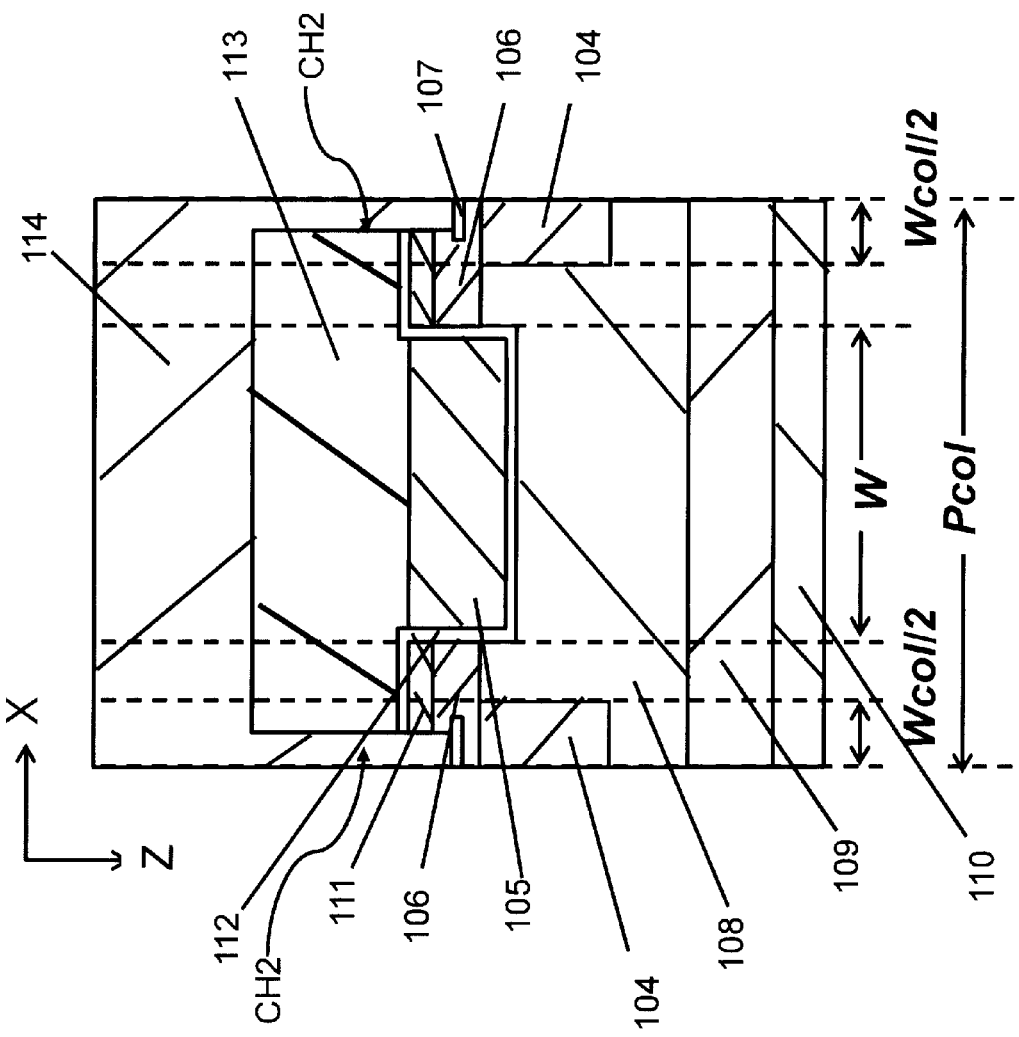
FIG. 10 is a cross-sectional view of main portion of the unit cell UC in FIG. 9.

(Second modified example) A second modified example of the first embodiment is shown in FIGS. 9 and 10. Compared to the first embodiment, the second modified example is changed in that the trench gate 105 with the minimum trench width Wtr is formed with a honeycomb structure in a plan view to improve the gate density, and the p-type column region 104 is disposed with staggered in a plan view. The relationship between the trench gate 105 and the p-type column region 104 even in this configuration, when following the line connecting the adjacent p-type column region 104 hypothetically, the unit cell UC is designed so that there is always overlap with the trench gate 105 of more than twice the width Wtr. Incidentally, FIG. 10 is a D-D cross-sectional view in FIG. 9.

In FIG. 10, a trench gate 105 having a width W in the X direction between the adjacent p-type column regions and a width Wtr in the Y direction is formed, the trench gate 105 is designed so that the width W is the twice or more of the width Wtr.

The structures of the second modified example has higher density of the trench gates 105 in the unit cells UC compared to the first embodiment. Therefore, since the channel density can be improved, it is possible to reduce the on-resistance of the vertical MOSFET. Further, even if designed so that the trench gate density is high, since the occupancy rate of the p-type column region of the unit cell in a plan view can be reduced, it is possible to ensure a wide current path. Therefore, the on-resistance can be reduced without having to excessively increase the impurity concentration of the p-type column region and the n-type drift region.

Figure 11:
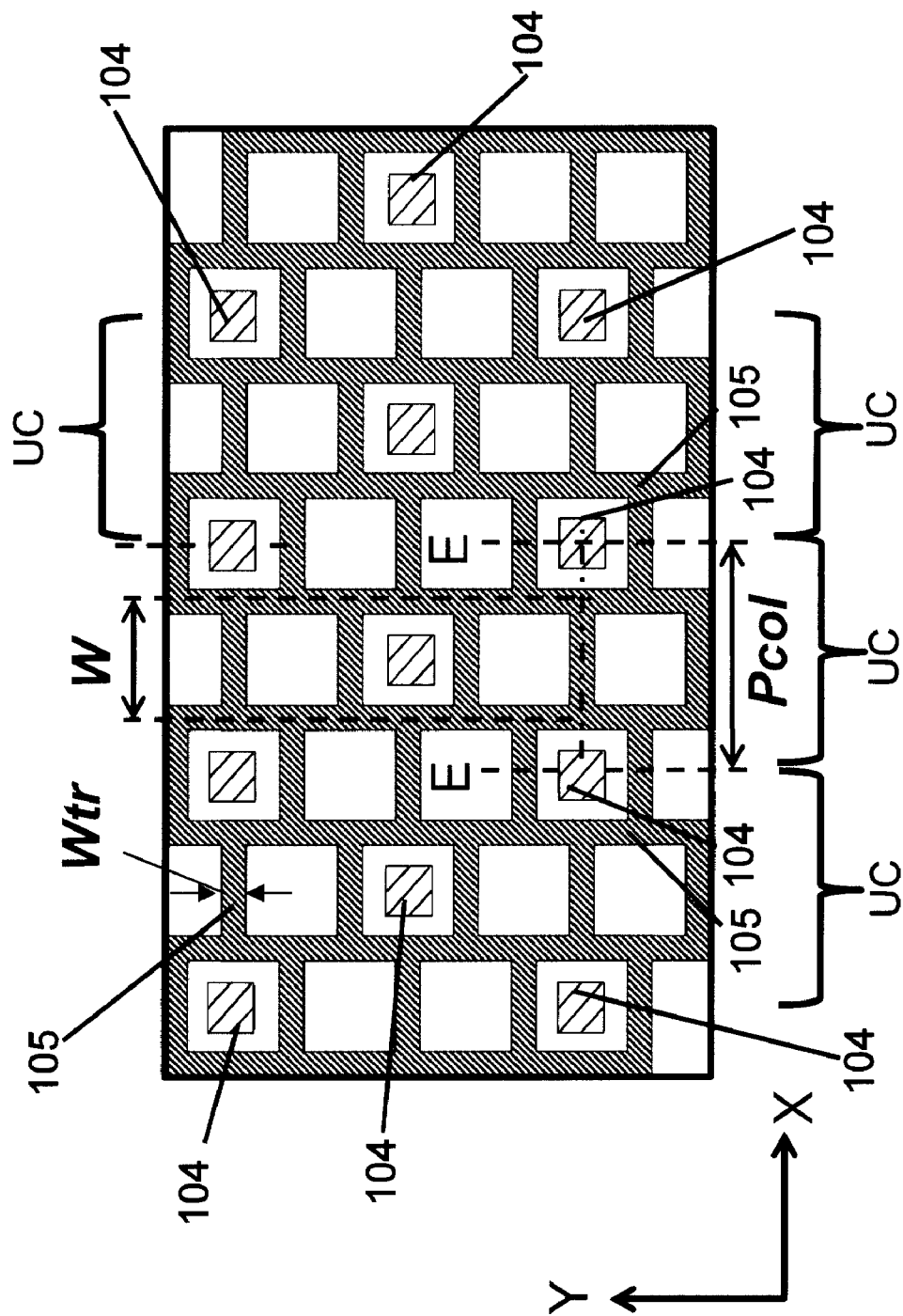
FIG. 11 is an enlarged plan view of the cell area showing a third modified example of a semiconductor device with a vertical MOSFET structure according to an embodiment.
Figure 12:
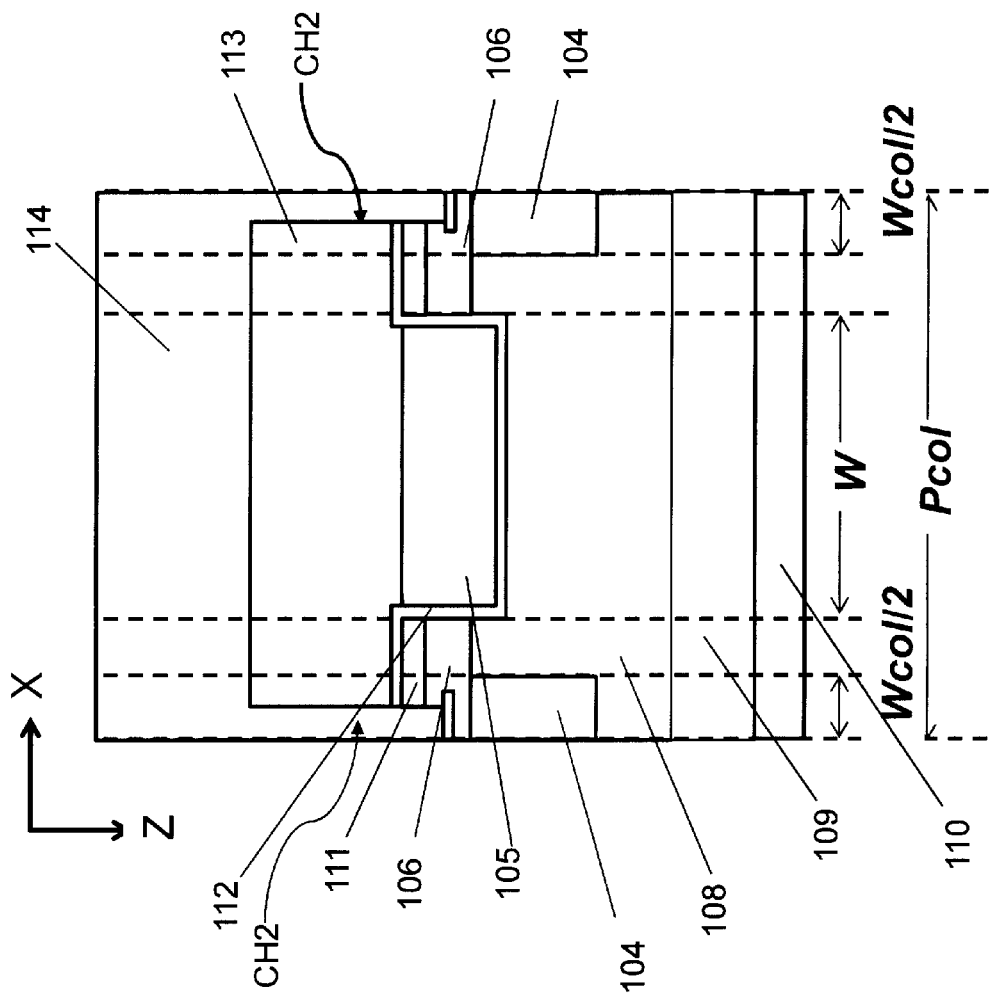
FIG. 12 is a cross-sectional view of main portion of the unit cell UC in FIG. 11.

(Third modified example) A third modified example of the first embodiment is shown in FIGS. 11 and 12. Compared to the first embodiment, the third modified example is changed in that the trench gate 105 with the smallest trench width Wtr is formed in a grating structure in a planar view to improve the gate density, and the p-type column region 104 is disposed with staggered in a planar view. The relationship between the trench gate 105 and the p-type column region 104 even in this configuration, when following the line connecting the adjacent p-type column region 104 hypothetically, the unit cell UC is designed so that there is always overlap with the trench gate 105 of more than twice the width Wtr. FIG. 12 is an E-E cross-sectional view of FIG. 11.

In FIG. 12, a trench gate 105 having a width W in the X direction and a width Wtr in the Y direction is formed between the adjacent p-type column regions, and the trench gate 105 is designed so that the width W is twice the width Wtr or more.

In the configuration of the third modified example, the density of the trench gate 105 in the unit cell UC is higher than that of the first embodiment. Therefore, since the channel density can be improved, it is possible to reduce the on-resistance of the vertical MOSFET. Further, even if designed so that the trench gate density is high, since the occupancy rate of the p-type column region of the unit cell in a plan view can be reduced, it is possible to ensure a wide current path. Therefore, the on-resistance can be reduced without having to excessively increase the impurity concentration of the p-type column region and the n-type drift region.

Hereinafter, a manufacturing method of the semiconductor device including a vertical MOSFET according to an embodiment of the present disclosure will be described.

Figure 13:
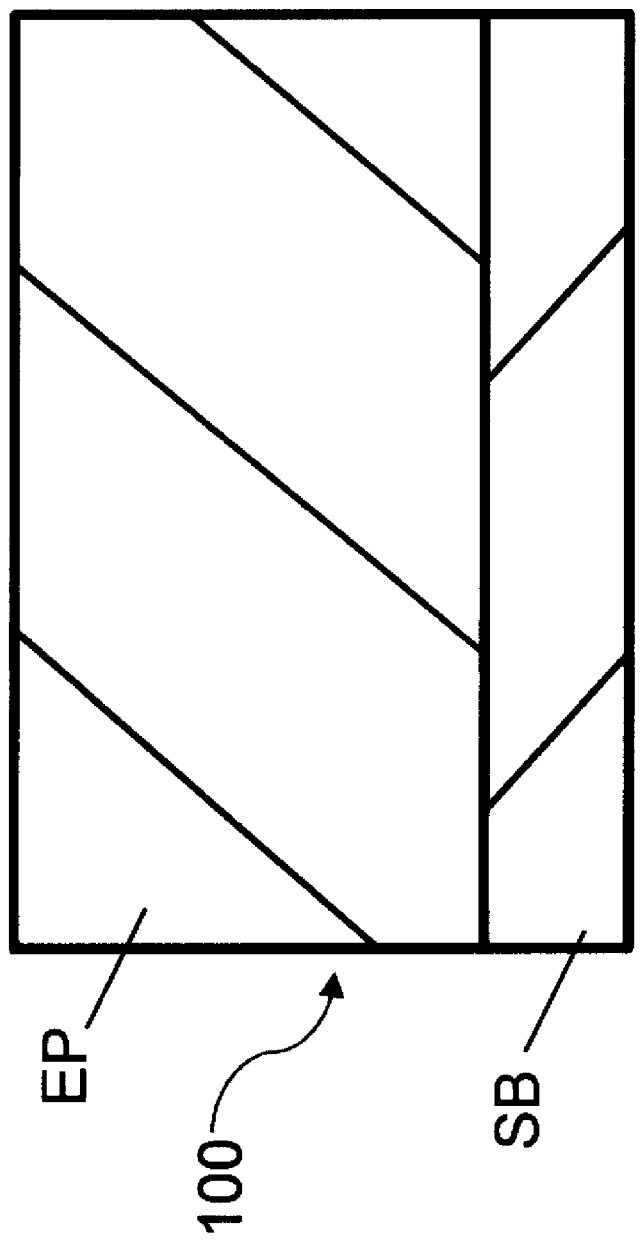
FIG. 13 is a cross-sectional view of main portion illustrating a manufacturing process of a semiconductor device with a vertical MOSFET structure according to an embodiment.

As shown in FIG. 13, for example, a semiconductor substrate 100 with an epitaxial layer EP formed on a silicon substrate SB of a crystal plane (100) comprising n-type high concentration semiconductor layer is prepared.

Figure 14:
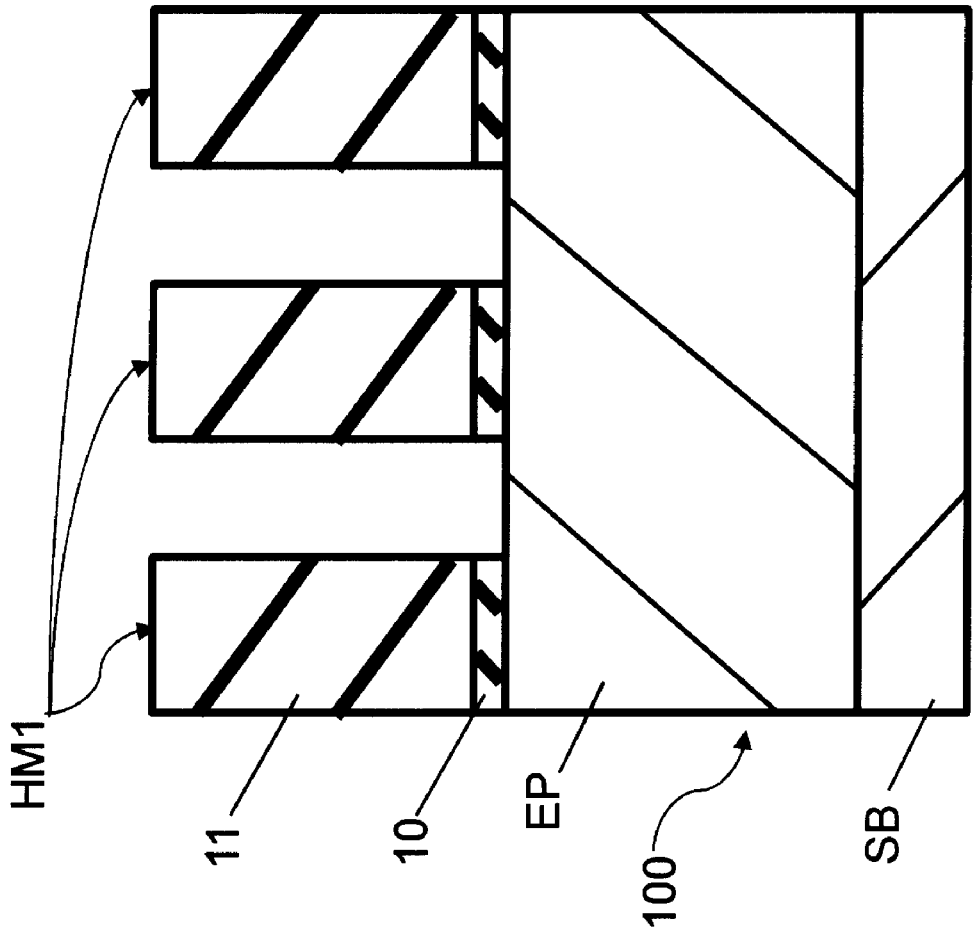
FIG. 14 is a cross-sectional view of main portion illustrating the manufacturing process of a semiconductor device with a vertical MOSFET structure following FIG. 13.

Next, as shown in FIG. 14, a hard mask HM1 formed by the photo-resist film 11 and the insulating film 10 are formed on the upper surface of the epitaxial layer EP.

Figure 15:
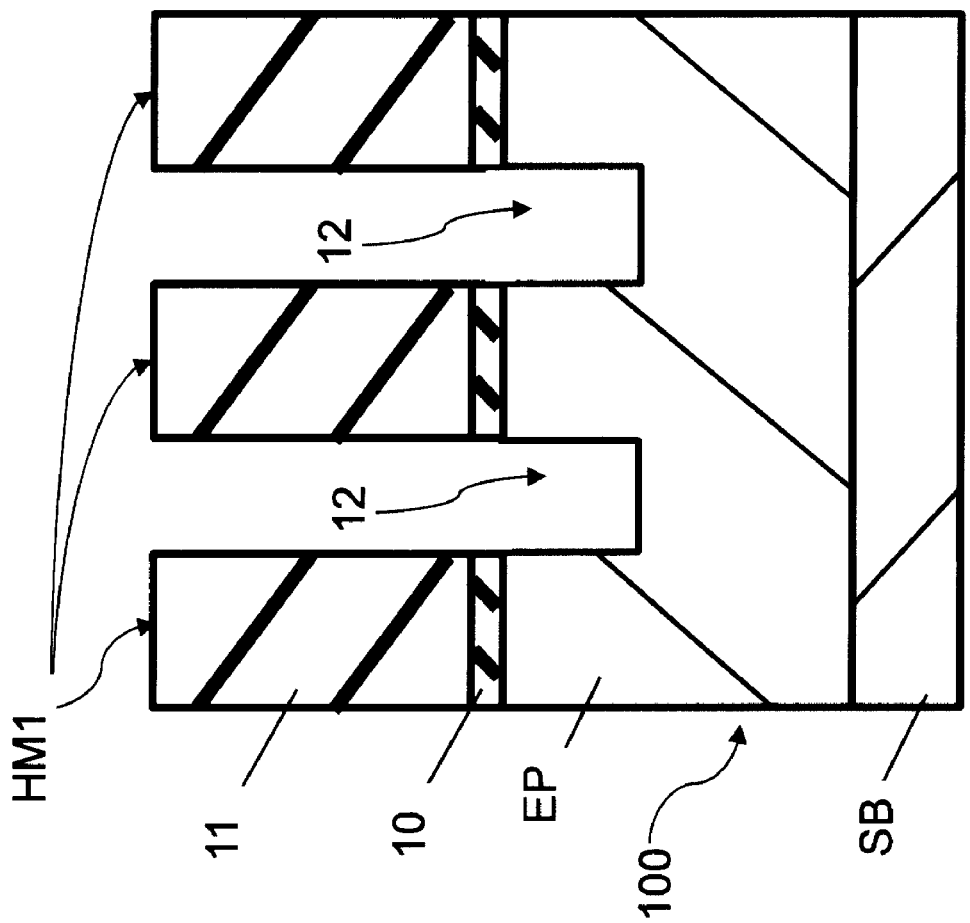
FIG. 15 is a cross-sectional view of main portion illustrating the manufacturing process of a semiconductor device with a vertical MOSFET structure following FIG. 14.

Next, as shown in FIG. 15, the upper surface of the epitaxial layer EP exposed from the hard mask HM1 is etched to form a trench 12 for the trench gate.

Figure 16:
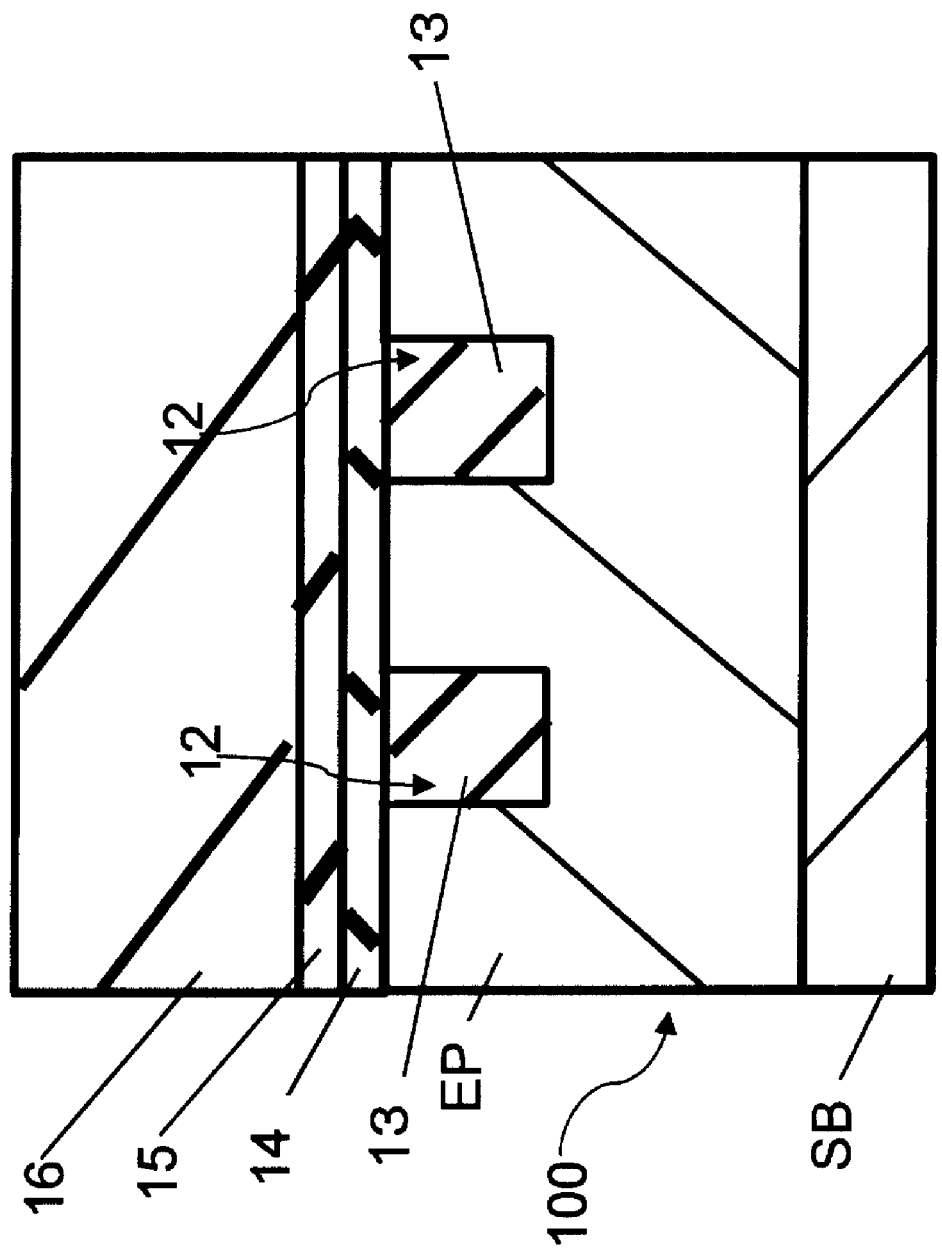
FIG. 16 is a cross-sectional view of main portion illustrating the manufacturing process of a semiconductor device with a vertical MOSFET structure following FIG. 15.

Next, after the hard mask HM1 is removed, as shown in FIG. 16, an insulating film 14, an insulating film 15, and an insulating film 16 are sequentially formed on the upper surface of the epitaxial layer EP after trench 12 is filled with an insulating film 13. As the insulating film 14 and the insulating film 16, for example, a silicon oxide film formed by a CVD method is used. As the insulating film 15, a silicon nitride film formed by a CVD method is used.

Figure 17:
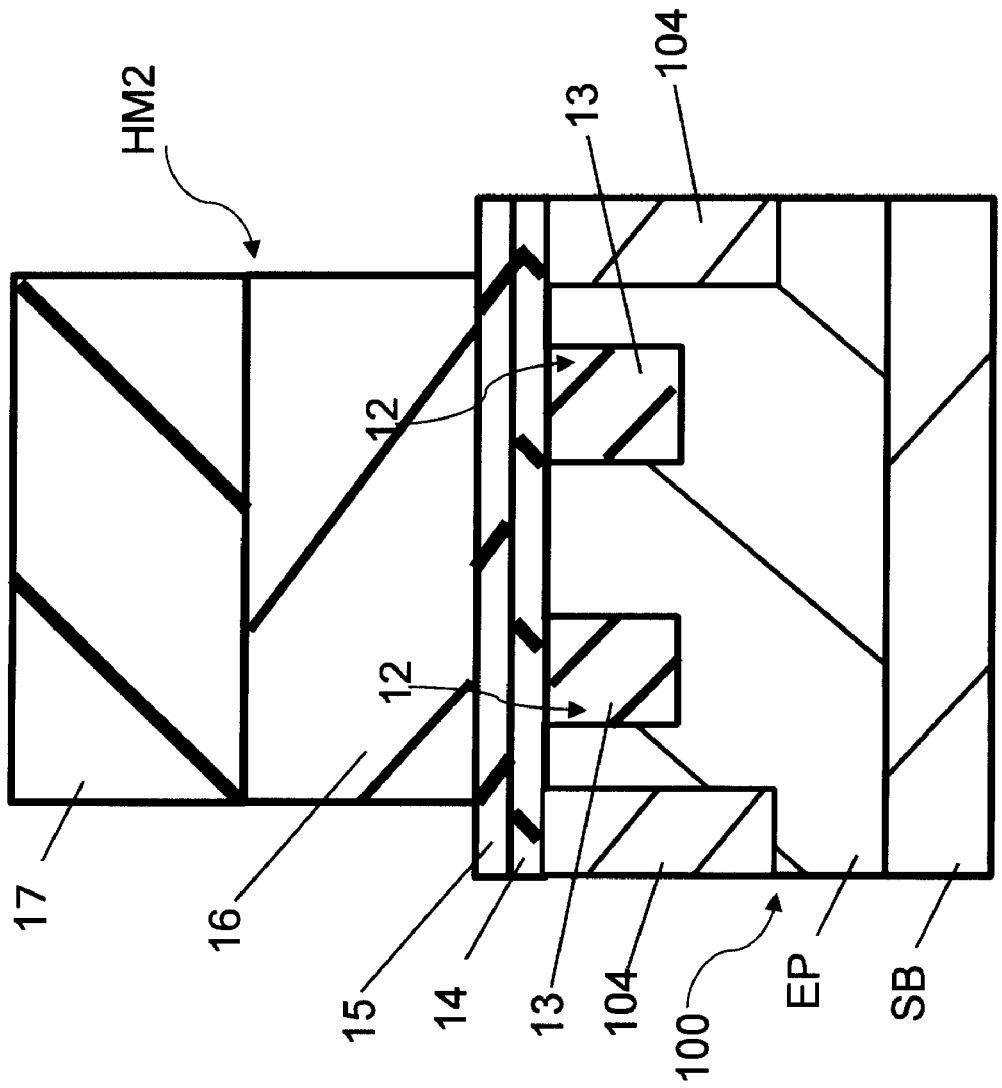
FIG. 17 is a cross-sectional view of main portion illustrating the manufacturing process of a semiconductor device with a vertical MOSFET structure following FIG. 16.

Next, as shown in FIG. 17, the hard mask HM2 formed by the photo resist film 17 and the insulating film 16 is formed by a conventional photolithography and etching technique. Next, using the hard mask HM2 as a mask for introducing impurities, p-type impurities such as boron, for example, are ion-implanted into the epitaxial layers EP to form p-type column regions 104.

Figure 18:
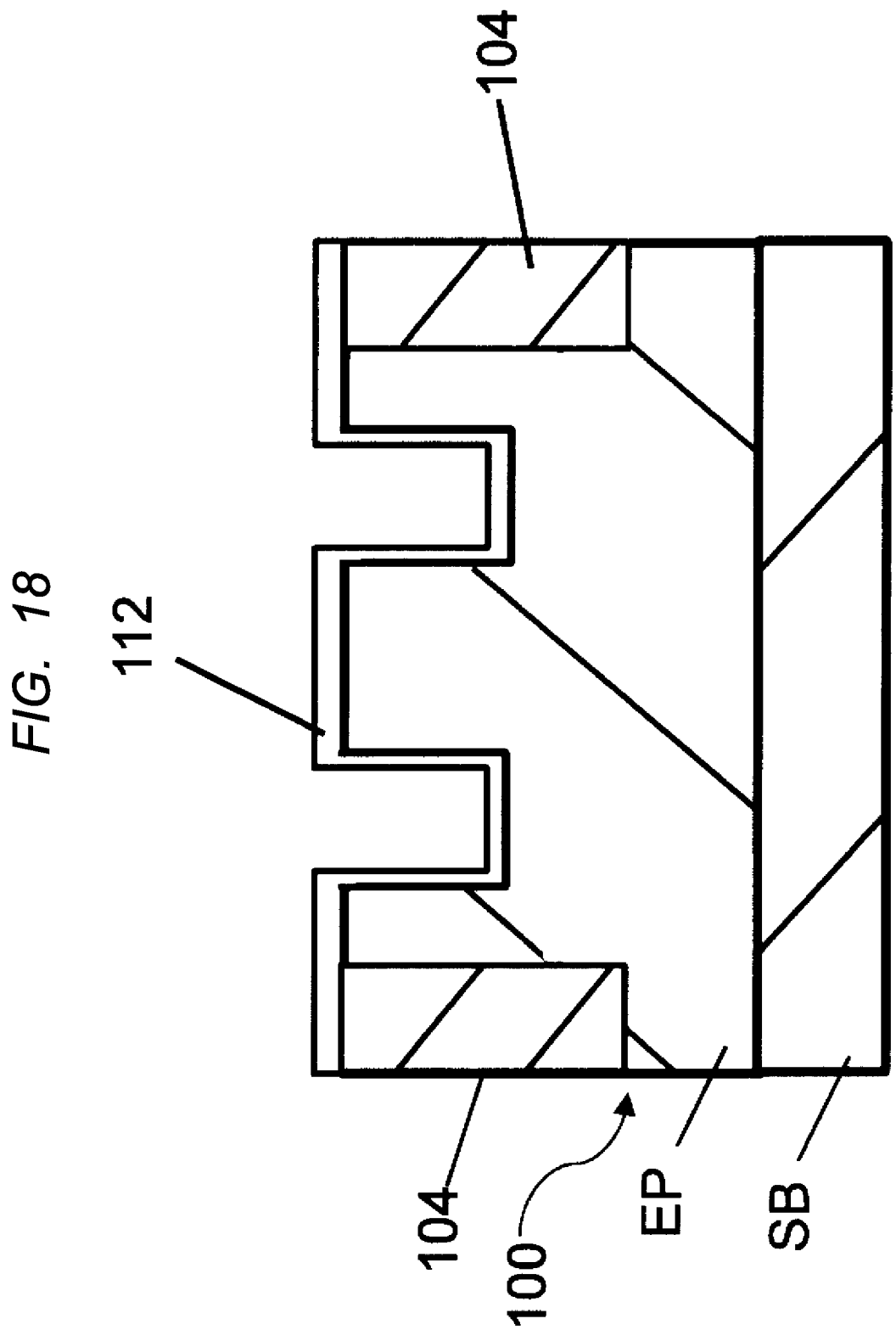
FIG. 18 is a cross-sectional view of main portion illustrating the manufacturing process of a semiconductor device with a vertical MOSFET structure following FIG. 17.

Next, after the hard mask HM2, the insulating film 15, and the insulating film 14 are removed, as shown in FIG. 18, a gate insulating film 112 is formed on the surface of the epitaxial layer EP including the surface of trench 12 by, for example, a thermal oxidization process.

Figure 19:
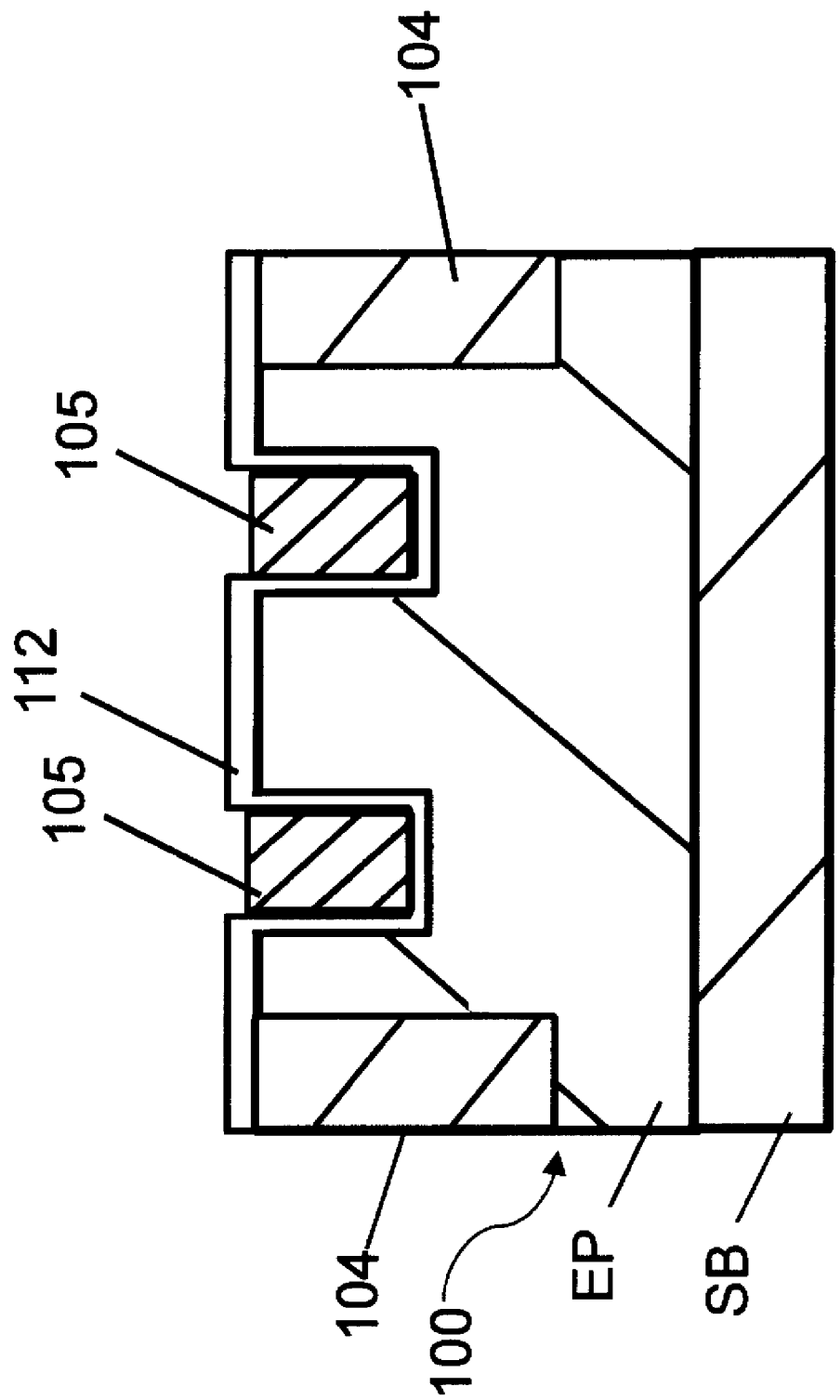
FIG. 19 is a cross-sectional view of main portion illustrating the manufacturing process of a semiconductor device with a vertical MOSFET structure following FIG. 18.

Next, as shown in FIG. 19, a trench gate 105 is formed so as to embed trench 12. The trench gate 105 is formed by, for example, a polycrystalline silicon film doped with an n-type impurity and is selectively formed in trench 12 by depositing a polycrystalline silicon film on the entire surface of semiconductor substrate 100 and then etching back by the chemical-mechanical polishing, i.e., CMP.

Figure 20:
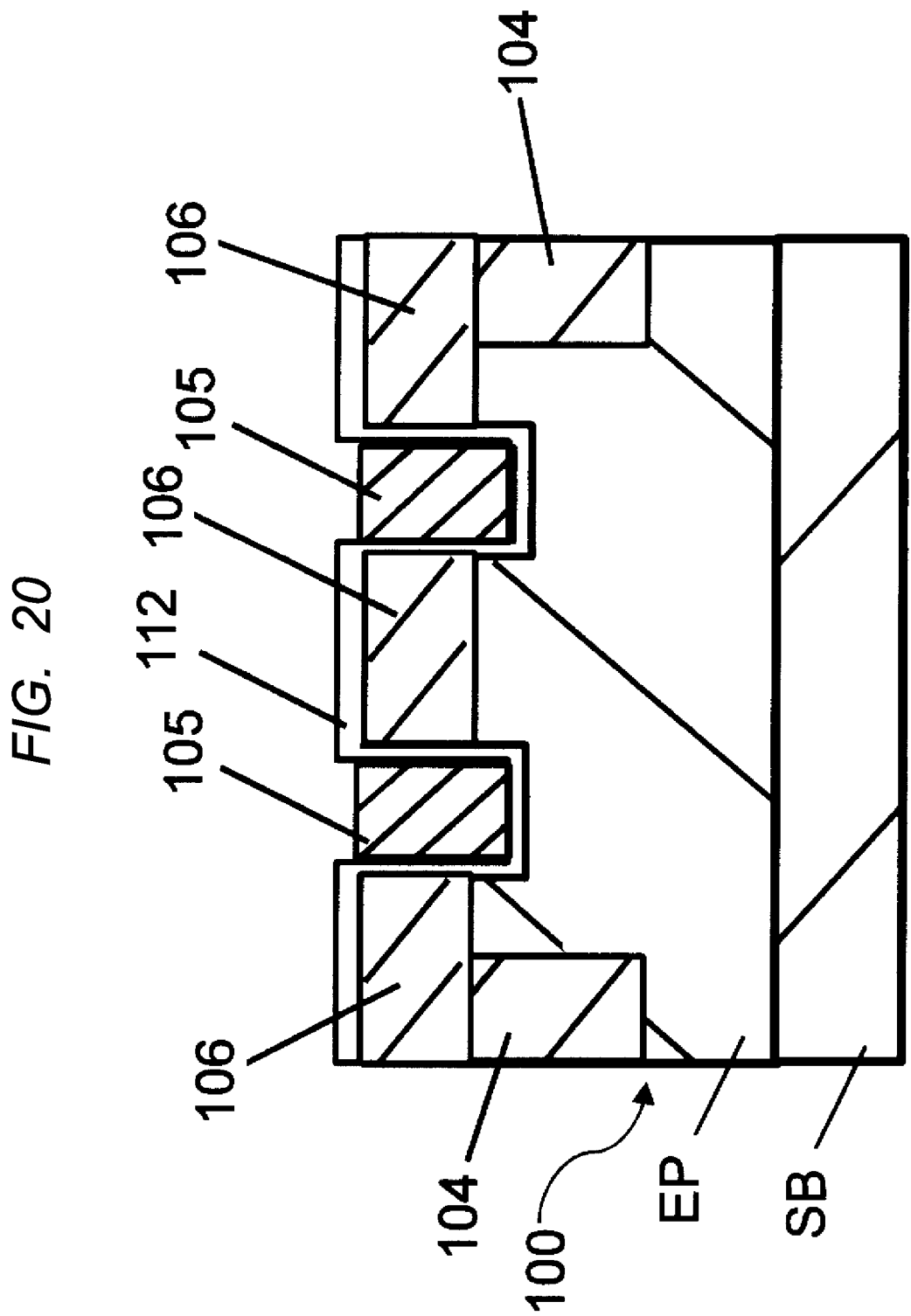
FIG. 20 is a cross-sectional view of main portion illustrating the manufacturing process of a semiconductor device with a vertical MOSFET structure following FIG. 19.

Next, as shown in FIG. 20, a p-type impurity such as boron are selectively ion-implanted into the epitaxial layer EP to form a p-type base region 106. The p-type base region 106 is formed between the adjacent trench gates 105, and is formed to be coupled to the p-type column region 104, and is also formed at a position shallower than the bottom surface of the trench gate 105.

Figure 21:
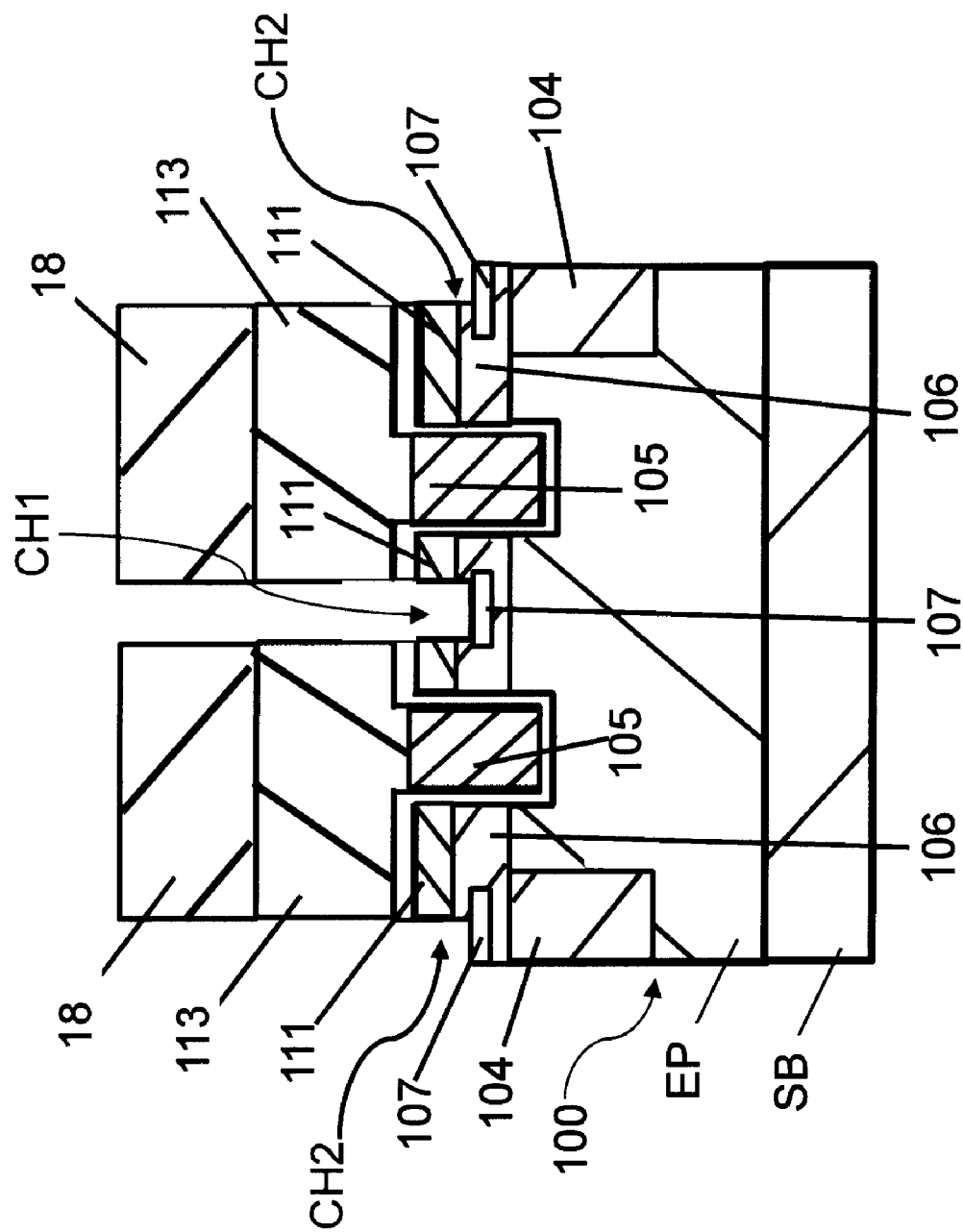
FIG. 21 is a cross-sectional view of main portion illustrating the manufacturing process of a semiconductor device with a vertical MOSFET structure following FIG. 20.

Next, as shown in FIG. 21, an n-type impurity such as arsenic is selectively ion-implanted into the epitaxial layer EP to form n+ type source regions 111. The n+ source region 111 is formed on the surface of the p-type base region 106 and located at the end of the trench gate 105.

Next, an insulating film 113 is formed on the entire surface of semiconductor substrate 100, and then the insulating film 113 is patterned by ordinary photolithography and etching techniques using the photo resist film 18 to form contact holes CH1 and CH2 in the insulating film 113. The contact hole CH1 and CH2 are formed between the adjacent trench gates 105 and on a p-type column region 104, respectively. Further, the bottom surface of the contact hole CH1 and CH2 is formed so as to reach the p-type base region 106 by etching the surface of the epitaxial layer EP partially.

Figure 22:
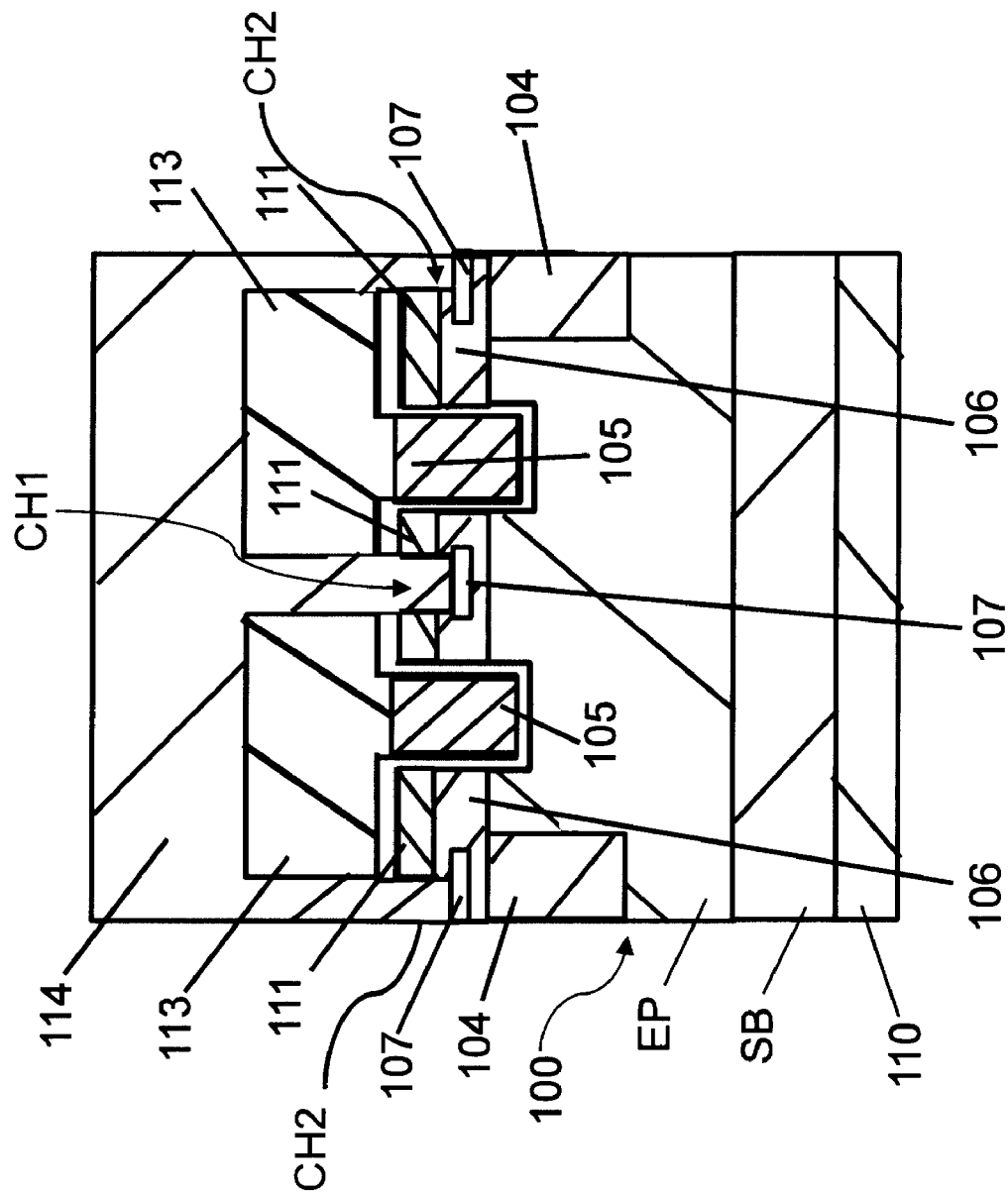
FIG. 22 is a cross-sectional view of main portion illustrating the manufacturing process of a semiconductor device with a vertical MOSFET structure following FIG. 21.

Next, a p+ type base contact region 107 is formed in the p-type base region 106 exposed from the contact holes CH1 and CH2 by ion implantation of a p-type impurity using the photo-resist film 18 and the insulating film 113 as a mask. Next, after removing the photo resist film 18, as shown in FIG. 22, a source electrode 114 containing, for example, aluminum as a main component is formed, and a drain electrode 110 having a multilayer structure made of, for example, Au/Cu/Ni is formed on the lower surface of the semiconductor substrate 100, thereby completing a vertical MOSFET.

Although the invention made by the present inventor has been specifically described based on the embodiment, the present invention is not limited to the embodiment described above, and various modifications can be made without departing from the gist thereof.

For example, although the present invention has shown a vertical MOSFET of the n-channel, the present invention can also be applied to a vertical MOSFET of the p-channel. In that case, the source region, the drain region, the base region (also referred to as the channel forming region), and the conductivity type of the semiconductor layer constituting the drift region may be configured in reverse.

Further, the stripe-like shape p-type column region 104 shown in FIGS. 2 and 7 may be disposed interspersed in the n-type drift region with disposed in a staggered or in a meshed shape in a plan view as shown in FIGS. 23 to 26. FIGS. 23 to 26 are plan view showing a semiconductor device in a fourth modified example to 8.

Figure 23:
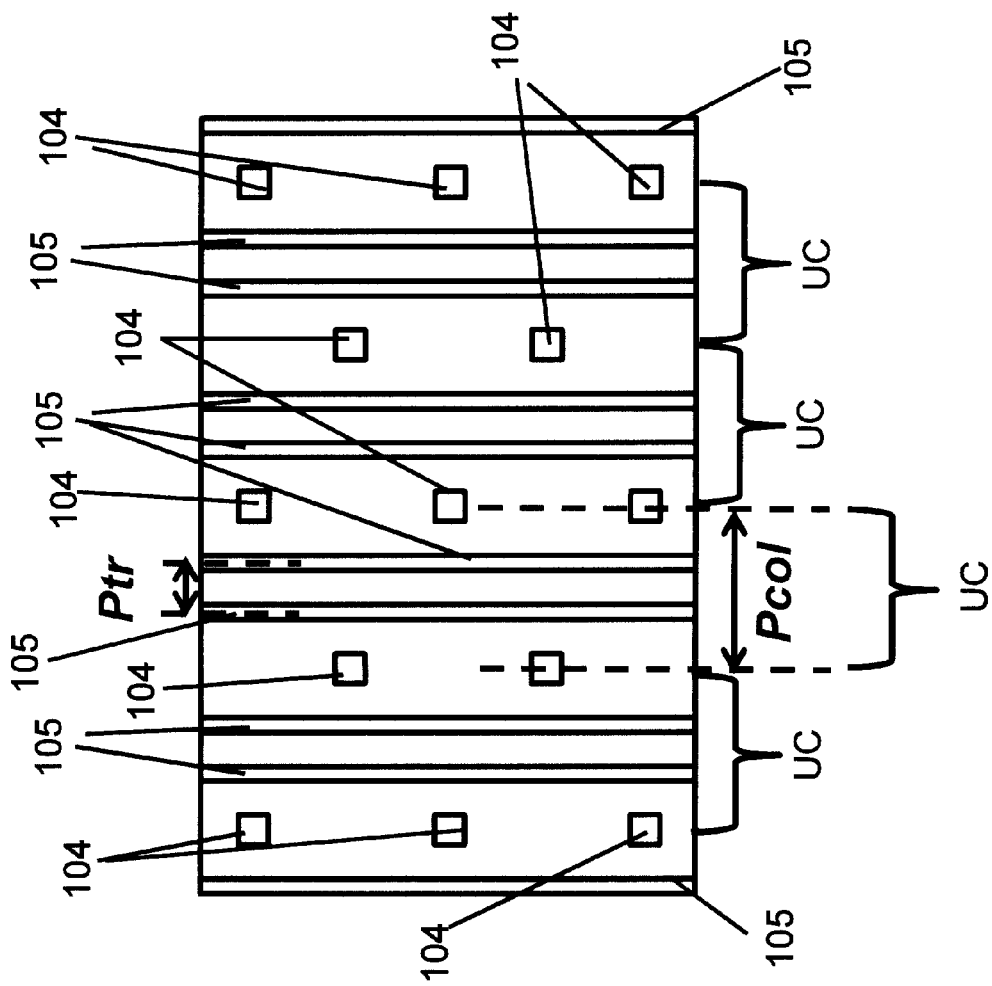
FIG. 23 is an enlarged plan view of the cell area showing fourth modified example of a semiconductor device with a vertical MOSFET structure according to an embodiment.
Figure 24:
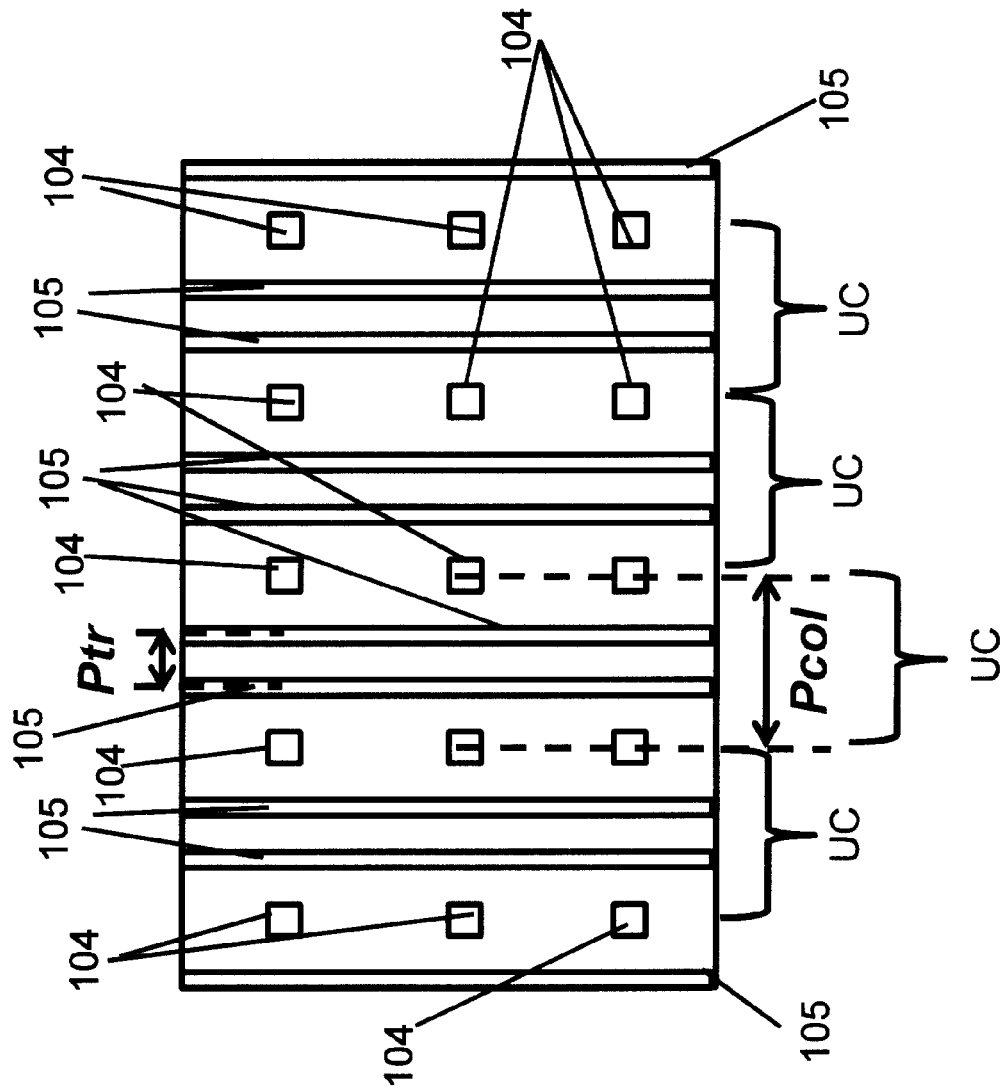
FIG. 24 is an enlarged plan view of the cell area showing fifth modified example of a semiconductor device with a vertical MOSFET structure according to an embodiment.
Figure 25:
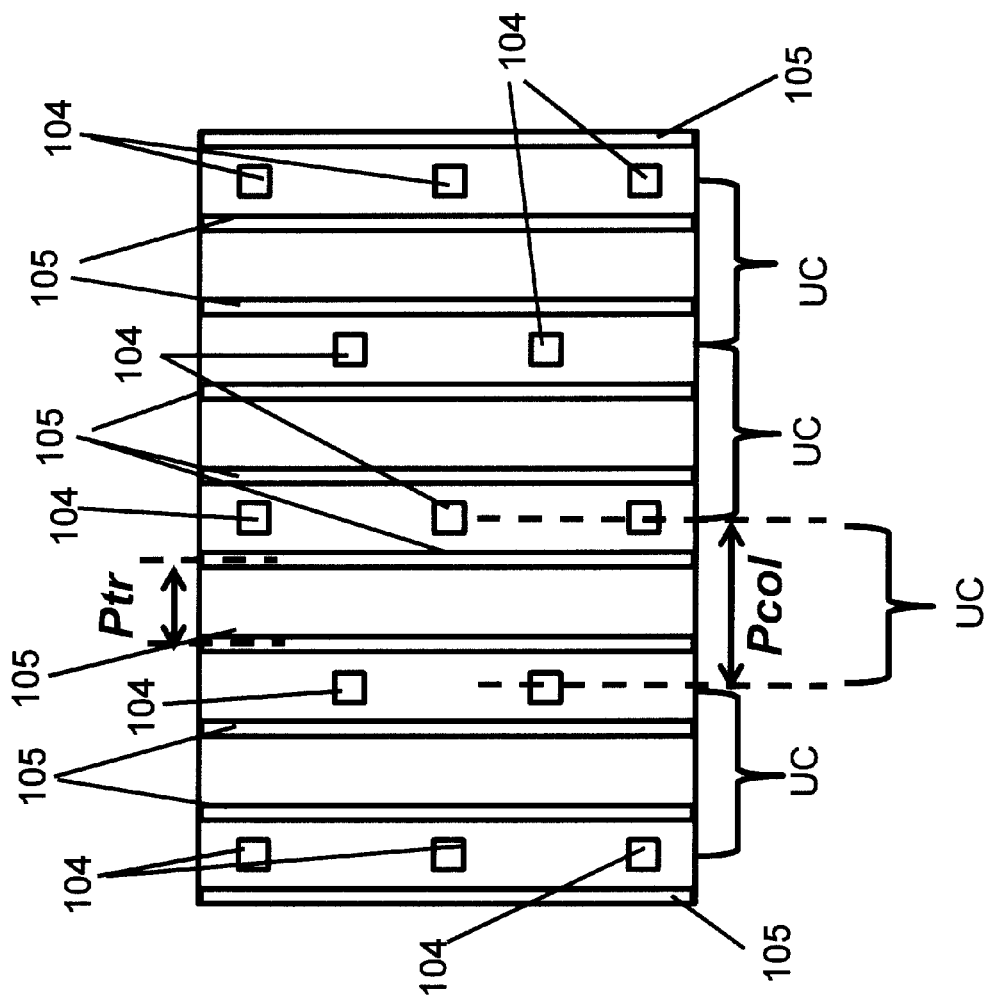
FIG. 25 is an enlarged plan view of the cell area showing modified example 6 of a semiconductor device with a vertical MOSFET structure according to an embodiment.
Figure 26:
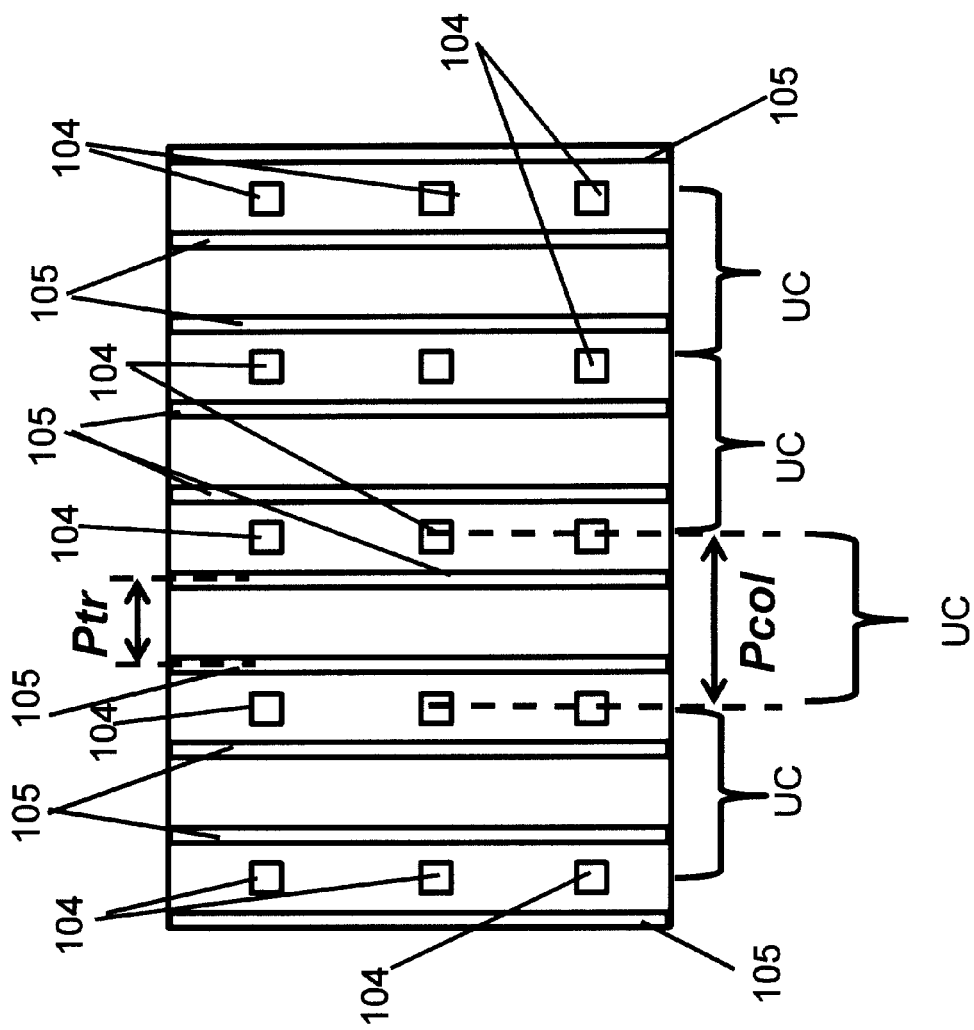
FIG. 26 is an enlarged plan view of the cell area showing modified example 7 of a semiconductor device with a vertical MOSFET structure according to an embodiment.

In this case, as shown in FIGS. 23 to 26, the occupancy of the p-type column region 104 in a plan view is lowest in the staggered arrangement shown in FIGS. 23 and 25, since the width of the current path is widened, the effect of on-resistance reduction is high. Further, even in the case of the square mesh arrangement shown in FIGS. 24 and 26, since the width of the current path is bigger than the stripe arrangement shown in FIGS. 2 and 7, the effect of on resistance reduction is high.

On the other hand, since the ease of depletion required to obtain a high breakdown voltage prefer short distance between the p-type column regions, and the uniform relationship of the PN junction formed by the p-type column region and the n-type column region (n-type drift region), it becomes the opposite to the ease of on-resistance reduction, and it's suitable for high breakdown voltage in the order of stripe-like shape arrangement, square meshed arrangement, and staggered arrangement.

Figure 27:
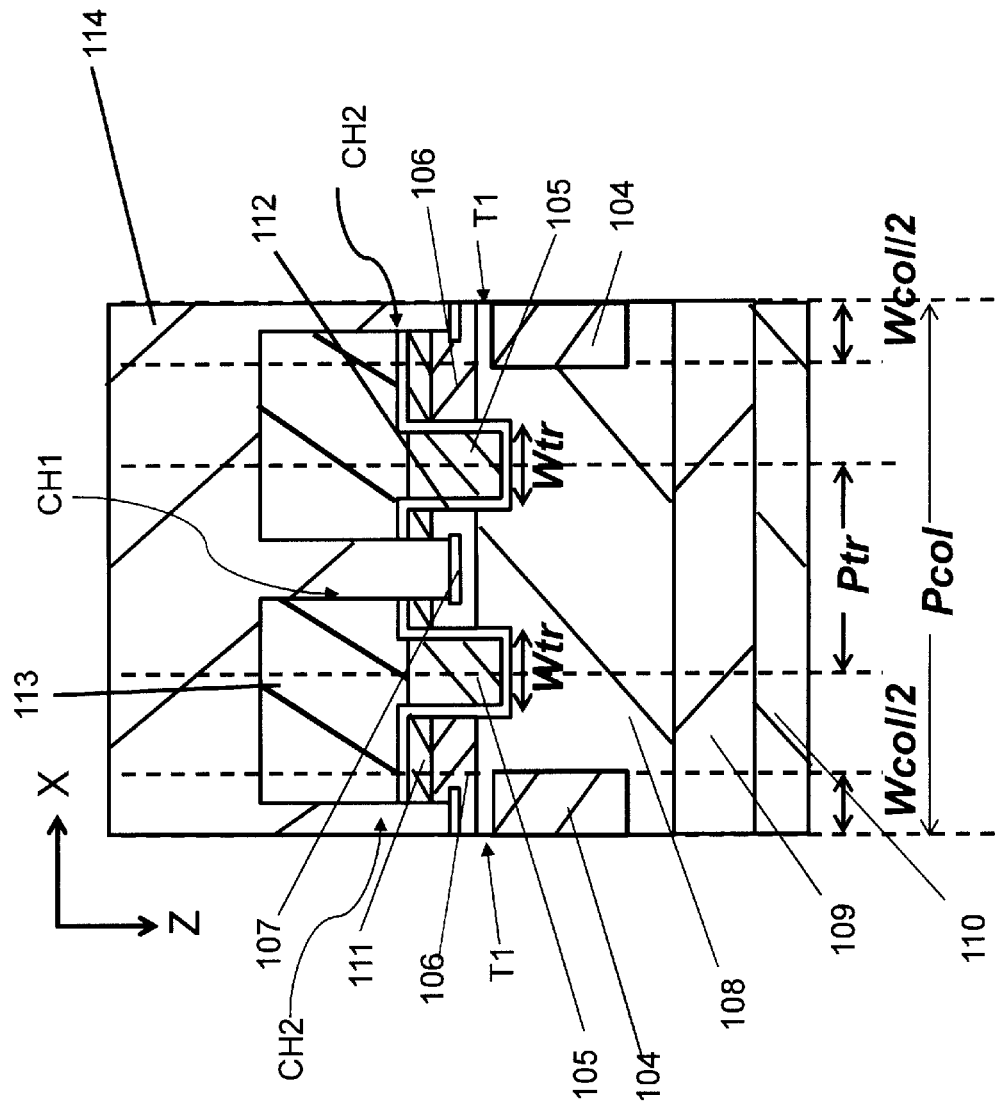
FIG. 27 is an enlarged plan view of the cell area showing modified example 8 of a semiconductor device with a vertical MOSFET structure according to an embodiment.

As shown in FIG. 27, the p-type column region 104 may not be directly coupled to the bottom surface of the p-type base region 106. In this case, although the p-type column region 104 becomes a state in which the p-type column region 104 is surrounded by n− type drift region 108 and then the potential is floating, the thickness T1 of the n-type region between the p-type base region 106 and the p-type column region 104 may be set to a thickness enough to suppress the suppliable barrier of a hole from the p-type base region 106 to the p-type column region 104, during actual operation of the vertical MOSFET, The thickness T1 of the n-type region between the p-type base region 106 and the p-type column region 104 can be set to, for example, about 0.5 μm as a preferable value.

With such a configuration, it can contribute to the breakdown voltage improvement of the vertical MOSFET since it is possible to optimize the distribution of the depletion layer more than the structure shown in FIG. 3.

What is claimed is:

1. A semiconductor device including a vertical MOSFET, the semiconductor device comprising:
   a semiconductor substrate having a drift region of a first conductivity type semiconductor layer;
   a base region of a second conductivity type semiconductor layer opposite to the first conductivity type, the base region being formed on a surface of the drift region;
   a plurality of column regions of the second conductivity type semiconductor layer, the plurality of column regions being disposed in the drift region at a predetermined interval;
   a plurality of trenches formed in the drift region, the plurality of trenches each having a bottom surface deeper than the base region, the plurality of trenches including a first trench and a second trench, the first trench and the second trench both being disposed between two adjacent column regions of the plurality of column regions in plan view such that i) the first trench and the second trench parallel the two adjacent column regions and ii) the first trench and the second trench are disposed between the two adjacent column regions without overlapping the two adjacent column regions in plan view;
   a plurality of gate electrodes that is formed so as to be embedded in the plurality of trenches through a gate insulating film formed on each surface of the plurality of trenches; and
   a plurality of source regions of the first conductivity type semiconductor layer formed in the base region, the plurality of source regions being formed on both sides of each of the plurality of gate electrodes,
   wherein the plurality of gate electrodes includes two gate electrodes,
   wherein, in plan view, the two gate electrodes are disposed adjacent each other without any column regions disposed between the two gate electrodes,
   wherein the plurality of column regions and the plurality of gate electrodes are formed in a stripe-like shape along a first direction in plan view, and
   wherein the plurality of column regions is disposed apart from the bottom surface of the base region at a predetermined distance in a thickness direction of the semiconductor substrate, the thickness direction traversing the first direction.

2. The semiconductor device according to claim 1, wherein a bottom surface of each of the plurality of column regions lies in the drift region at a position deeper than the bottom surface of each of the plurality of trenches.

3. The semiconductor device according to claim 1, wherein any pair of adjacent electrodes of the plurality of gate electrodes includes no more than one column region of the plurality of column regions in plan view.

4. The semiconductor device according to claim 1, wherein an interval of the two adjacent column regions of the plurality of column regions is set to more than twice an interval of two adjacent gate electrodes of the plurality of gate electrodes.

5. The semiconductor device according to claim 1, wherein the plurality of column regions are disposed to be coupled to a bottom surface of the base region.

* * * * *